(12) United States Patent
Varela Campelo

(10) Patent No.: US 11,626,891 B2
(45) Date of Patent: Apr. 11, 2023

(54) MULTIPLEXING CIRCUITS WITH BAW RESONATORS AS NETWORK ELEMENTS FOR HIGHER PERFORMANCE

(71) Applicant: Qorvo US, Inc., Greensboro, NC (US)

(72) Inventor: José Enrique Varela Campelo, Altamonte Springs, FL (US)

(73) Assignee: Qorvo US, Inc., Greensboro, NC (US)

( * ) Notice: Subject to any disclaimer, the term of this patent is extended or adjusted under 35 U.S.C. 154(b) by 316 days.

(21) Appl. No.: 16/909,207

(22) Filed: Jun. 23, 2020

(65) Prior Publication Data

US 2021/0399750 A1 Dec. 23, 2021

(51) Int. Cl.
*H04B 1/00* (2006.01)
*H03H 9/70* (2006.01)
*H03H 9/205* (2006.01)
*H03H 9/54* (2006.01)

(52) U.S. Cl.
CPC ............ *H04B 1/0057* (2013.01); *H03H 9/205* (2013.01); *H03H 9/542* (2013.01); *H03H 9/703* (2013.01)

(58) Field of Classification Search
CPC ...... H03B 1/0057; H03B 9/542; H03H 9/205; H03H 9/703; H04B 1/0057
See application file for complete search history.

(56) References Cited

U.S. PATENT DOCUMENTS

| | | | |
|---|---|---|---|
| 2007/0030094 A1 | 2/2007 | Omote | |
| 2016/0294423 A1 | 10/2016 | Yatsenko et al. | |
| 2017/0257078 A1 | 9/2017 | Leipold et al. | |
| 2017/0294896 A1 | 10/2017 | Nosaka | |
| 2018/0131344 A1 * | 5/2018 | Komatsu | ............... H03H 9/605 |

FOREIGN PATENT DOCUMENTS

| | | | |
|---|---|---|---|
| DE | 112017005456 T5 | * | 7/1919 |
| GB | 2448600 | * | 8/2008 |

OTHER PUBLICATIONS

Li, M., et al., "A Fully Matched LTE-A Carrier Aggregation Quadplexer Based on BAW and SAW Technologies," 2014 IEEE International Ultrasonics Symposium Proceedings, Sep. 3-6, 2014, Chicago, IL, IEEE, 4 pages.
Non-Final Office Action for U.S. Appl. No. 15/449,357, dated Jun. 15, 2018, 8 pages.
Notice of Allowance and Examiner-Initiated Interview Summary for U.S. Appl. No. 15/449,357, dated Dec. 19, 2018, 7 pages.

* cited by examiner

*Primary Examiner* — Dinh T Le
(74) *Attorney, Agent, or Firm* — Withrow & Terranova, P.L.L.C.

(57) ABSTRACT

Multiplexing circuits with bulk acoustic wave (BAW) resonators as network elements for higher performance are provided. Multiplexing networks which support newer fourth generation (4G) and fifth generation (5G) standards may include a combination of multiplexers having a number of radio frequency (RF) filters connected to an antenna at the same time. One critical aspect of such a multiplexer design is the loading of these filters to each other, in which the static capacitance presented by a filter can be beneficial or detrimental to other filters in the multiplexing network. Aspects of the present disclosure introduce a BAW resonator to improve multiplexing network performance using the frequency-dependent capacitance, resonance, and/or anti-resonance of the BAW resonator.

22 Claims, 20 Drawing Sheets

MULTIPLEXING CIRCUITS WITH BAW RESONATORS AS NETWORK ELEMENTS FOR HIGHER PERFORMANCE

FIELD OF THE DISCLOSURE

The present disclosure relates to radio frequency (RF) communications systems, and more particularly to RF multiplexer circuitry.

BACKGROUND

As wireless communications technologies evolve, wireless communications systems become increasingly sophisticated. To maximize flexibility, many wireless communications devices must be capable of supporting any number of wireless communications protocols and communications bands, each of which may have certain performance requirements, such as specific out-of-band emissions requirements, linearity requirements, or the like. Further, portable wireless communications devices are typically battery powered and need to be relatively small and low cost. As such, to minimize size, cost, and power consumption, RF circuitry in such a device needs to be as simple, small, flexible, and efficient as is practical.

With the latest wireless communications standards, such as the fourth generation (4G) and fifth generation (5G) standards from the Third Generation Partnership Project (3GPP), the architecture of RF modules and other circuitries are becoming more sophisticated. For example, to support carrier aggregation and other new features, many RF modules have evolved from comprising several duplexers connected separately to a switch into comprising a combination of multiplexers with several filters all connected to an antenna at the same time. However, this architecture presents new challenges in meeting performance requirements.

SUMMARY

Multiplexing circuits with bulk acoustic wave (BAW) resonators as network elements for higher performance are provided. Multiplexing networks which support newer fourth generation (4G) and fifth generation (5G) standards may include a combination of multiplexers having a number of radio frequency (RF) filters connected to an antenna at the same time. One critical aspect of such a multiplexer design is the loading of these filters to each other, in which the static capacitance presented by a filter can be beneficial or detrimental to other filters in the multiplexing network. Aspects of the present disclosure introduce a BAW resonator to improve multiplexing network performance using the frequency-dependent capacitance, resonance, and/or anti-resonance of the BAW resonator.

In this regard, embodiments of the present disclosure provide multiplexer circuitry with a BAW resonator configured to provide isolation between RF bands or otherwise improve performance of one or more RF bands in a multiplexing network. BAW resonators can perform as a frequency dependent capacitor featuring a zero and a pole. At resonance, a BAW resonator presents very low impedance and at anti-resonance it has a very high impedance. Embodiments use these properties, for example where lower frequency multiplexed bands benefit from a higher capacitance value and higher frequency bands benefit from a lower capacitance value. In addition, the resonance and anti-resonance of the BAW resonator can be used to produce high-Q open- and short-circuits to improve circuit performance. Multiple BAW resonators may be used to provide various similar benefits to different components of the multiplexing network.

An exemplary embodiment provides a multiplexing circuit, comprising: an antenna node configured to couple to an RF antenna; a plurality of transceiver nodes configured to couple to transceiver circuitry; and multiplexing circuitry coupled between the antenna node and the plurality of transceiver nodes. The multiplexer circuitry comprises a first branch coupled between a connection node and a first transceiver node of the plurality of transceiver nodes, the first branch comprising a first RF filter; a second branch coupled to the connection node; and a first BAW resonator coupled to the connection node and configured to isolate the first branch from the second branch in a first frequency range of interest.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
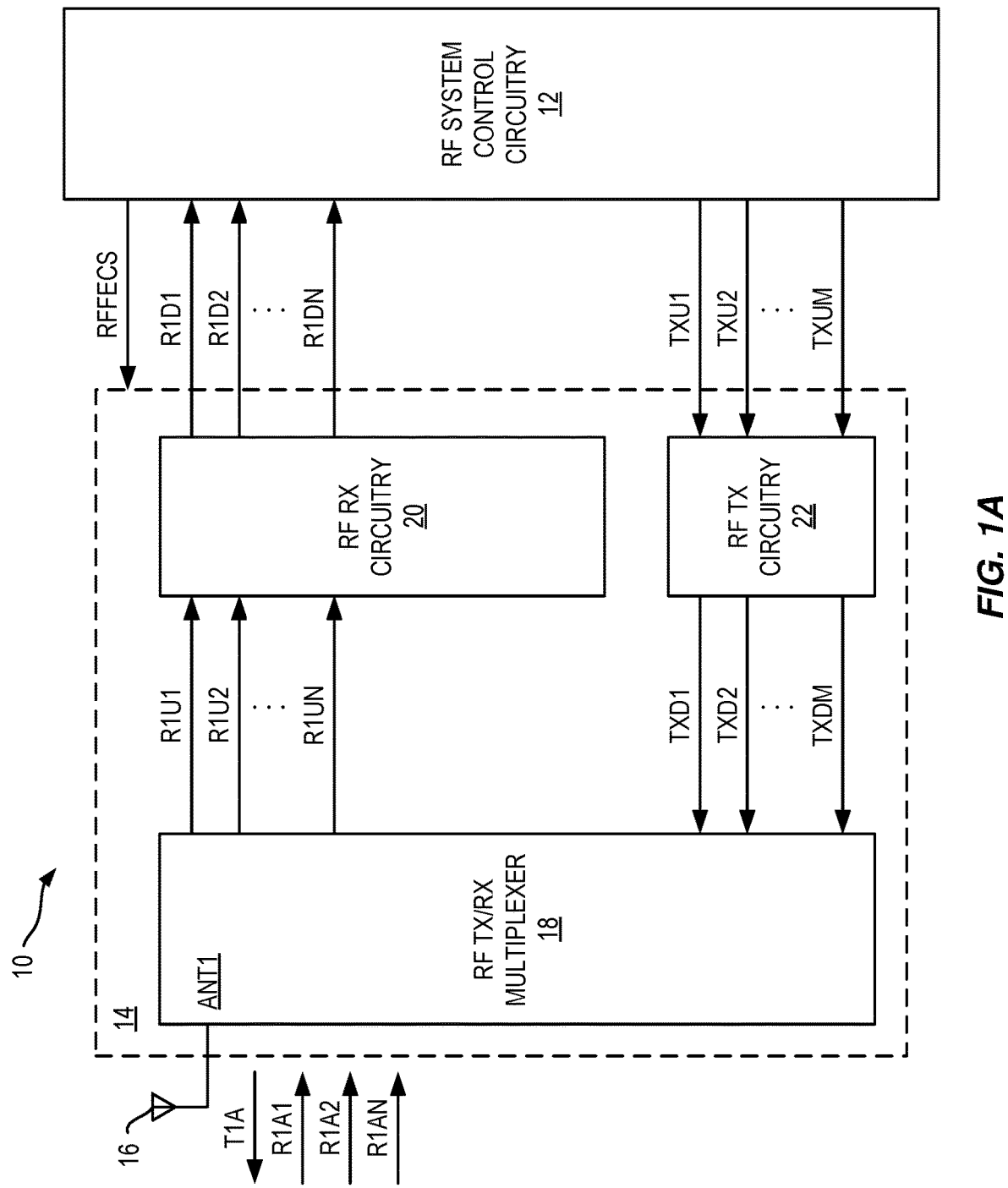
FIG. 1A is a schematic block diagram of radio frequency (RF) communications circuitry according to an embodiment disclosed herein.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Multiplexing circuits with bulk acoustic wave (BAW) resonators as network elements for higher performance are provided. Multiplexing networks which support newer fourth generation (4G) and fifth generation (5G) standards may include a combination of multiplexers having a number of radio frequency (RF) filters connected to an antenna at the same time. One critical aspect of such a multiplexer design is the loading of these filters to each other, in which the static capacitance presented by a filter can be beneficial or detrimental to other filters in the multiplexing network. Aspects of the present disclosure introduce a BAW resonator to improve multiplexing network performance using the frequency-dependent capacitance, resonance, and/or anti-resonance of the BAW resonator.

In this regard, embodiments of the present disclosure provide multiplexer circuitry with a BAW resonator configured to provide isolation between RF bands or otherwise improve performance of one or more RF bands in a multiplexing network. BAW resonators can perform as a frequency dependent capacitor featuring a zero and a pole. At resonance, a BAW resonator presents very low impedance and at anti-resonance it has a very high impedance. Embodiments use these properties, for example where lower frequency multiplexed bands benefit from a higher capacitance value and higher frequency bands benefit from a lower capacitance value. In addition, the resonance and anti-resonance of the BAW resonator can be used to produce high-Q open- and short-circuits to improve circuit performance. Multiple BAW resonators may be used to provide various similar benefits to different components of the multiplexing network.

FIG. 1A is a schematic block diagram of RF communications circuitry 10 according to an embodiment disclosed herein. The RF communications circuitry 10 includes RF system control circuitry 12, RF front-end circuitry 14, and a first RF antenna 16. The RF front-end circuitry 14 includes an RF transmit (TX)/receive (RX) multiplexer 18, RF RX circuitry 20, and RF TX circuitry 22. The RF TX/RX multiplexer 18 has a first antenna node ANT1, which is coupled to the first RF antenna 16. In one embodiment of the RF TX/RX multiplexer 18, the first antenna node ANT1 is directly coupled to the first RF antenna 16. In some examples, the RF system control circuitry 12 provides an RF front-end control signal RFFECS to the RF front-end circuitry 14 to configure switching or other operations of the RF front-end circuitry 14.

In one embodiment of the RF system control circuitry 12, the RF system control circuitry 12 provides a first upstream RF TX signal TXU1, a second upstream RF TX signal TXU2, and up to and including an $M^{TH}$ upstream RF TX signal TXUM to the RF TX circuitry 22. In general, the RF system control circuitry 12 provides a group of upstream RF TX signals TXU1, TXU2, TXUM to the RF TX circuitry 22.

The RF TX circuitry 22 processes the first upstream RF TX signal TXU1 to provide a first downstream RF TX signal TXD1 to the RF TX/RX multiplexer 18, the second upstream RF TX signal TXU2 to provide a second downstream RF TX signal TXD2 to the RF TX/RX multiplexer 18, and up to and including the $M^{TH}$ upstream RF TX signal TXUM to provide an $M^{TH}$ downstream RF TX signal TXDM to the RF TX/RX multiplexer 18. In general, the RF TX circuitry 22 provides a group of downstream RF TX signals TXD1, TXD2, TXDM to the RF TX/RX multiplexer 18.

In one embodiment of the RF system control circuitry 12, the RF system control circuitry 12 selects one of the group of downstream RF TX signals TXD1, TXD2, TXDM using the RF front-end control signal RFFECS, such that the RF TX/RX multiplexer 18 processes and forwards the selected one of the group of downstream RF TX signals TXD1, TXD2, TXDM to the first antenna node ANT1 to provide a first RF antenna TX signal T1A, which is transmitted via the first RF antenna 16.

The RF TX circuitry 22 may include up-conversion circuitry, amplification circuitry, power supply circuitry, filtering circuitry, switching circuitry, combining circuitry, splitting circuitry, dividing circuitry, clocking circuitry, the like, or any combination thereof to process the first upstream RF TX signal TXU1. In one embodiment of the RF TX circuitry 22, the RF TX circuitry 22 includes circuitry to reduce interference of RF RX signals in the RF TX/RX multiplexer 18 by processing the group of downstream RF TX signals TXD1, TXD2, TXDM in the RF TX/RX multiplexer 18.

In one embodiment of the RF TX/RX multiplexer 18, the RF TX/RX multiplexer 18 receives any or all of a first antenna, first RF RX signal R1A1; a first antenna, second RF RX signal R1A2; and up to and including a first antenna, $N^{TH}$ RF RX signal R1AN; which are received via the first RF antenna 16. In general, the RF TX/RX multiplexer 18 receives any or all of a group of first antenna, RF RX signals R1A1, R1A2, R1AN from the first antenna node ANT1. In one embodiment of the group of first antenna, RF RX signals R1A1, R1A2, R1AN, any or all of the group of first antenna, RF RX signals R1A1, R1A2, R1AN are received simultaneously, such that the RF TX/RX multiplexer 18 supports RX downlink carrier aggregation (RXDLCA).

The RF TX/RX multiplexer 18 processes and forwards any or all of the group of first antenna, RF RX signals R1A1, R1A2, R1AN from the first antenna node ANT1 to provide any or all of a first antenna, first upstream RF RX signal R1U1, a first antenna, second upstream RF RX signal R1U2, and up to and including a first antenna, $N^{TH}$ upstream RF RX signal R1UN. In general, the RF TX/RX multiplexer 18 provides any or all of a group of first antenna, upstream RF RX signals R1U1, R1U2, R1UN to the RF RX circuitry 20.

In one embodiment of the RF RX circuitry 20, the RF RX circuitry 20 receives and processes any or all of the group of the first antenna, upstream RF RX signals R1U1, R1U2, R1UN to provide a corresponding any or all of a group of first antenna, downstream RF RX signals R1D1, R1D2, R1DN.

In an additional embodiment of the RF RX circuitry 20, the RF RX circuitry 20 simultaneously receives and processes any or all of the group of first antenna, upstream RF RX signals R1U1, R1U2, R1UN. As such, the RF RX circuitry 20 supports RXDLCA. The RF RX circuitry 20 may include down-conversion circuitry, amplification circuitry, low noise amplification circuitry, power supply circuitry, filtering circuitry, switching circuitry, combining circuitry, splitting circuitry, dividing circuitry, clocking circuitry, the like, or any combination thereof.

In one embodiment of the RF front-end circuitry 14, any or all of the group of first antenna, RF RX signals R1A1, R1A2, R1AN and the first RF antenna TX signal T1A, any or all of the group of first antenna, upstream RF RX signals R1U1, R1U2, R1UN, any or all of the group of first antenna, downstream RF RX signals R1D1, R1D2, R1DN, any or all of the group of upstream RF TX signals TXU1, TXU2, TXUM, and any or all of the group of downstream RF TX signals TXD1, TXD2, TXDM are omitted.

In one embodiment of the RF system control circuitry 12, the RF system control circuitry 12 provides the RF front-end control signal RFFECS to the RF TX/RX multiplexer 18, the RF RX circuitry 20, and/or the RF TX circuitry 22. As such, the RF system control circuitry 12 may configure, tune, adjust, enable, disable, vary, or any combination thereof, circuits within the RF TX/RX multiplexer 18, the RF RX circuitry 20, the RF TX circuitry 22, or any combination thereof, as necessary using the RF front-end control signal RFFECS.

Figure 1B:
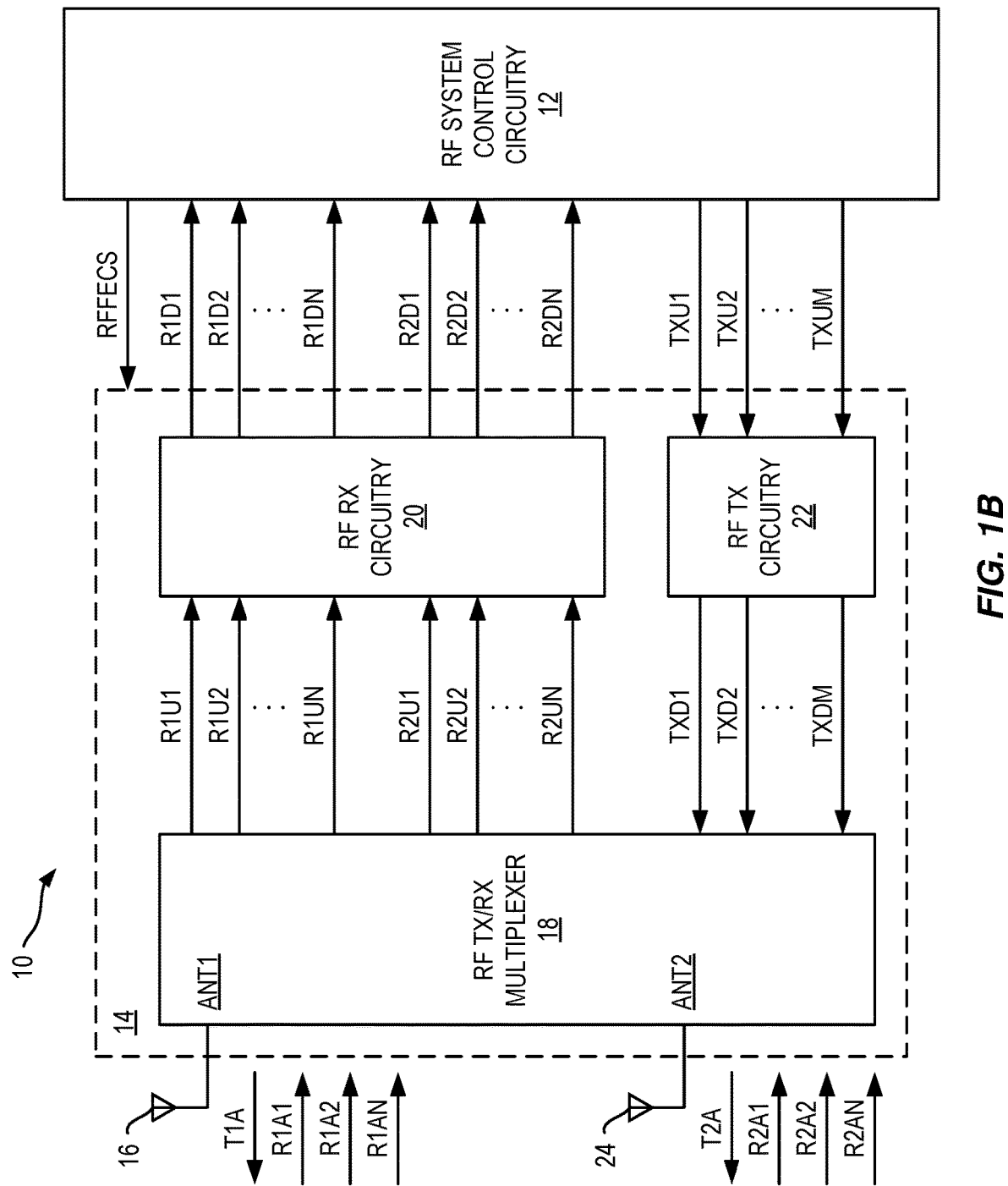
FIG. 1B is a schematic block diagram of the RF communications circuitry of FIG. 1A according to an alternate embodiment disclosed herein.

FIG. 1B is a schematic block diagram of the RF communications circuitry 10 of FIG. 1A according to an alternate embodiment disclosed herein. The RF communications circuitry 10 illustrated in FIG. 1B is similar to the RF communications circuitry 10 illustrated in FIG. 1A, except the RF communications circuitry 10 illustrated in FIG. 1B further includes a second RF antenna 24. Additionally, the RF TX/RX multiplexer 18 further has a second antenna node ANT2, which is coupled to the second RF antenna 24.

In one embodiment of the RF system control circuitry 12, the RF system control circuitry 12 selects one of the group of downstream RF TX signals TXD1, TXD2, TXDM using the RF front-end control signal RFFECS, such that the RF TX/RX multiplexer 18 processes and forwards the selected one of the group of downstream RF TX signals TXD1, TXD2, TXDM to a selected one of the first antenna node ANT1 and the second antenna node ANT2.

If the selected one of the first antenna node ANT1 and the second antenna node ANT2 is the first antenna node ANT1, then the RF TX/RX multiplexer 18 processes and forwards the selected one of the group of downstream RF TX signals TXD1, TXD2, TXDM to provide the first RF antenna TX signal T1A, which is transmitted via the first RF antenna 16. If the selected one of the first antenna node ANT1 and the second antenna node ANT2 is the second antenna node ANT2, then the RF TX/RX multiplexer 18 processes and forwards the selected one of the group of downstream RF TX signals TXD1, TXD2, TXDM to provide a second RF antenna TX signal T2A, which is transmitted via the second RF antenna 24.

In one embodiment of the RF TX/RX multiplexer 18, the RF TX/RX multiplexer 18 receives any or all of a second antenna, first RF RX signal R2A1; a second antenna, second RF RX signal R2A2; and up to and including a second antenna, $N^{TH}$ RF RX signal R2AN; which are received via the second RF antenna 24. In general, the RF TX/RX multiplexer 18 receives any or all of a group of first antenna, RF RX signals R1A1, R1A2, R1AN from the first antenna node ANT1 and any or all of a group of second antenna, RF RX signals R2A1, R2A2, R2AN from the second antenna node ANT2.

In one embodiment of the group of first antenna, RF RX signals R1A1, R1A2, R1AN and the group of second antenna, RF RX signals R2A1, R2A2, R2AN, any or all of the group of first antenna, RF RX signals R1A1, R1A2, R1AN and the group of second antenna, RF RX signals R2A1, R2A2, R2AN are received simultaneously, such that the RF TX/RX multiplexer 18 supports RXDLCA.

The RF TX/RX multiplexer 18 processes and forwards any or all of the group of first antenna, RF RX signals R1A1, R1A2, R1AN from the first antenna node ANT1 to provide any or all of the first antenna, first upstream RF RX signal R1U1, the first antenna, second upstream RF RX signal R1U2, and up to and including the first antenna, $N^{TH}$ upstream RF RX signal R1UN.

Further, the RF TX/RX multiplexer 18 processes and forwards any or all of the group of second antenna, RF RX signals R2A1, R2A2, R2AN from the second antenna node ANT2 to provide any or all of a second antenna, first upstream RF RX signal R2U1, a second antenna, second upstream RF RX signal R2U2, and up to and including a second antenna, $N^{TH}$ upstream RF RX signal R2UN.

In general, the RF TX/RX multiplexer 18 provides any or all of the group of first antenna, upstream RF RX signals R1U1, R1U2, R1UN and the group of second antenna, upstream RF RX signals R2U1, R2U2, R2UN to the RF RX circuitry 20.

In one embodiment of the RF RX circuitry 20, the RF RX circuitry 20 receives and processes any or all of the group of the first antenna, upstream RF RX signals R1U1, R1U2, R1UN and the group of the second antenna, upstream RF RX signals R2U1, R2U2, R2UN to provide a corresponding any or all of the group of first antenna, downstream RF RX signals R1D1, R1D2, R1DN and a group of second antenna, downstream RF RX signals R2D1, R2D2, R2DN.

In an additional embodiment of the RF RX circuitry 20, the RF RX circuitry 20 simultaneously receives and processes any or all of the group of first antenna, upstream RF RX signals R1U1, R1U2, R1UN and the group of second antenna, upstream RF RX signals R2U1, R2U2, R2UN. As such, the RF RX circuitry 20 supports RXDLCA.

Figure 2A:
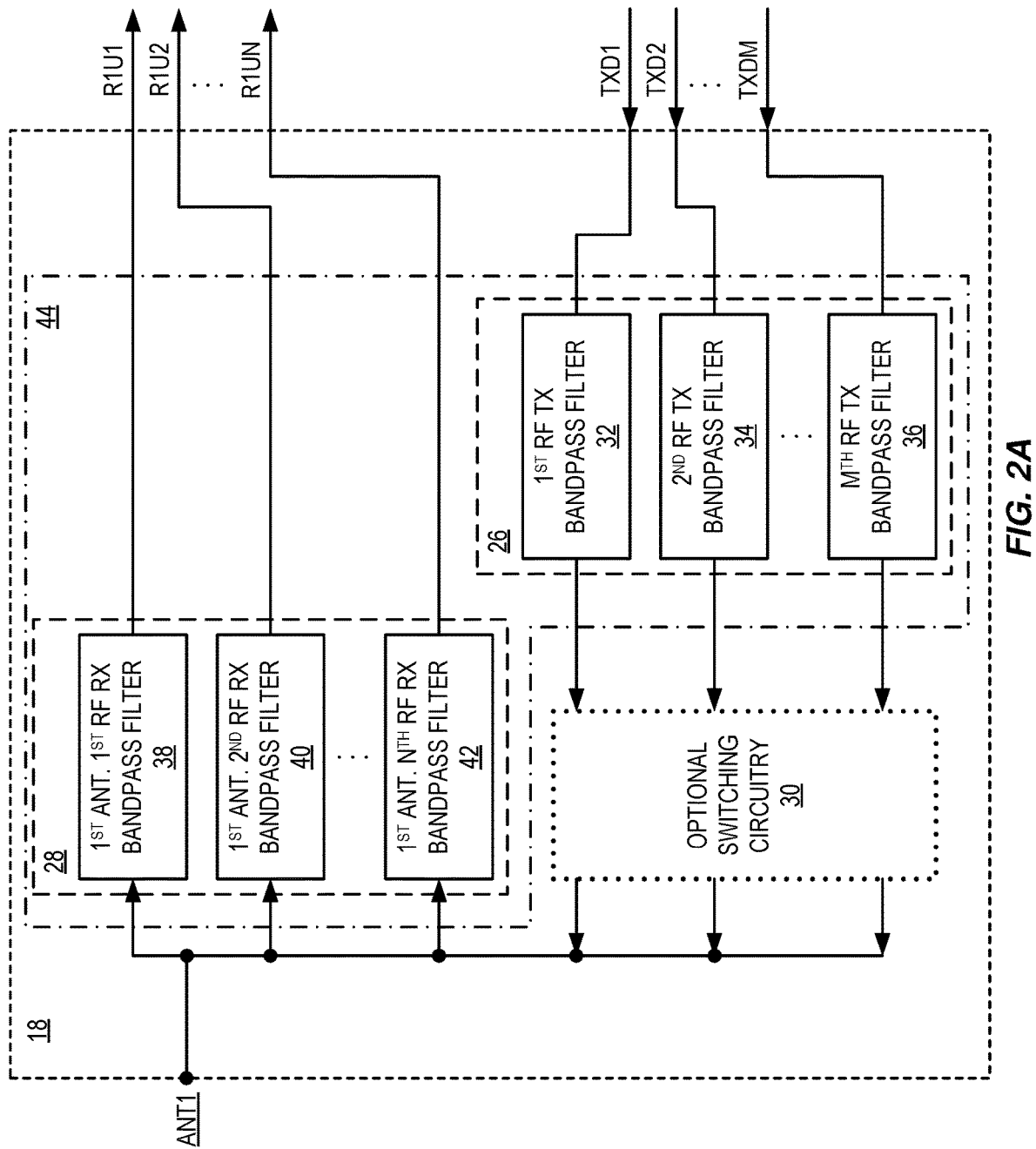
FIG. 2A is a schematic block diagram of an embodiment of an RF transmit (TX)/receive (RX) multiplexer in the RF communications circuitry of FIG. 1A.

FIG. 2A is a schematic block diagram of an embodiment of the RF TX/RX multiplexer 18 in the RF communications circuitry 10 of FIG. 1A. The RF TX/RX multiplexer 18 includes a group 26 of RF TX bandpass filters, a first group 28 of RF RX bandpass filters, and in some examples includes optional RF switching circuitry 30 comprising RF TX switching elements and/or RF RX switching elements. Additionally, the RF TX/RX multiplexer 18 has the first antenna node ANT1.

The group 26 of RF TX bandpass filters includes a first RF TX bandpass filter 32, a second RF TX bandpass filter 34, and up to and including an $M^{TH}$ RF TX bandpass filter 36. The first group 28 of RF RX bandpass filters includes a first antenna first RF RX bandpass filter 38, a first antenna second RF RX bandpass filter 40, and up to and including a first antenna $N^{TH}$ RF RX bandpass filter 42.

In one embodiment of the first group 28 of RF RX bandpass filters, each of the first group 28 of RF RX bandpass filters is coupled to the first antenna node ANT1. As such, the first antenna first RF RX bandpass filter 38 is coupled to the first antenna node ANT1, the first antenna second RF RX bandpass filter 40 is coupled to the first antenna node ANT1, and the first antenna $N^{TH}$ RF RX bandpass filter 42 is coupled to the first antenna node ANT1. In an alternate embodiment of the first group 28 of RF RX bandpass filters, any of the first group 28 of RF RX bandpass filters are omitted. In one embodiment of the first group 28 of RF RX bandpass filters, each of the first group 28 of RF RX bandpass filters is directly coupled to the first antenna node ANT1.

The first antenna first RF RX bandpass filter 38 receives and filters the first antenna, first RF RX signal R1A1 (FIG. 1A) via the first antenna node ANT1 to provide the first antenna, first upstream RF RX signal R1U1. The first antenna second RF RX bandpass filter 40 receives and filters the first antenna, second RF RX signal R1A2 (FIG. 1A) via the first antenna node ANT1 to provide the first antenna, second upstream RF RX signal R1U2. The first antenna $N^{TH}$ RF RX bandpass filter 42 receives and filters the first antenna, $N^{TH}$ RF RX signal R1AN (FIG. 1A) via the first antenna node ANT1 to provide the first antenna, $N^{TH}$ upstream RF RX signal R1UN. In general, the first group 28 of RF RX bandpass filters provides the group of first antenna, upstream RF RX signals R1U1, R1U2, R1UN.

In some embodiments, the optional RF switching circuitry 30 is coupled between the group 26 of RF TX bandpass filters and the first antenna node ANT1, such that one or more RF TX switching elements is coupled between the first antenna node ANT1 and one or more of the group 26 of RF TX bandpass filters. For example, when one of the group 26 of downstream RF TX signals TXD1, TXD2, TXDM is selected to provide the first RF antenna TX signal T1A (FIG. 1A), a corresponding RF TX switching element in the optional RF switching circuitry 30 is CLOSED, and other RF TX elements may be OPEN.

Figure 3A:
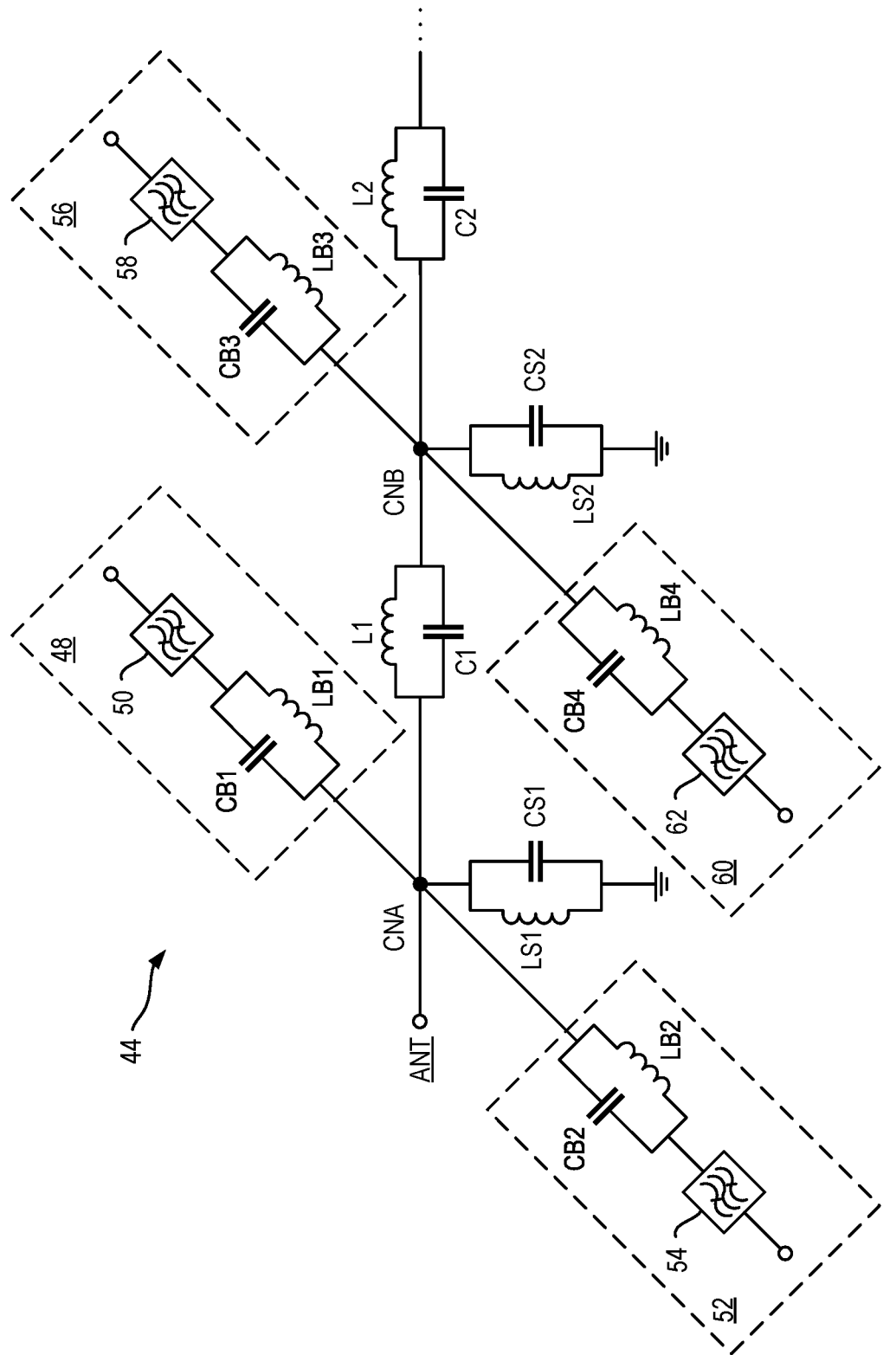
FIG. 3A is a circuit diagram of an exemplary generic multiplexing circuit in the RF TX/RX multiplexer of FIG. 2A or 2B.

In an exemplary aspect, the RF TX/RX multiplexer 18 includes a multiplexing circuit 44 which comprises a network of both TX and RX filters, such as illustrated in FIG. 3A. In other words, the multiplexing circuit 44 includes the group 26 of RF TX bandpass filters and the first group 28 of RF RX bandpass filters. Aspects of the present disclosure introduce a BAW resonator to improve performance of one or more of the RF TX bandpass filters 32, 34, 36 and/or the RF RX bandpass filters 38, 40, 42 in the multiplexing circuit 44 as will be discussed further below.

Figure 2B:
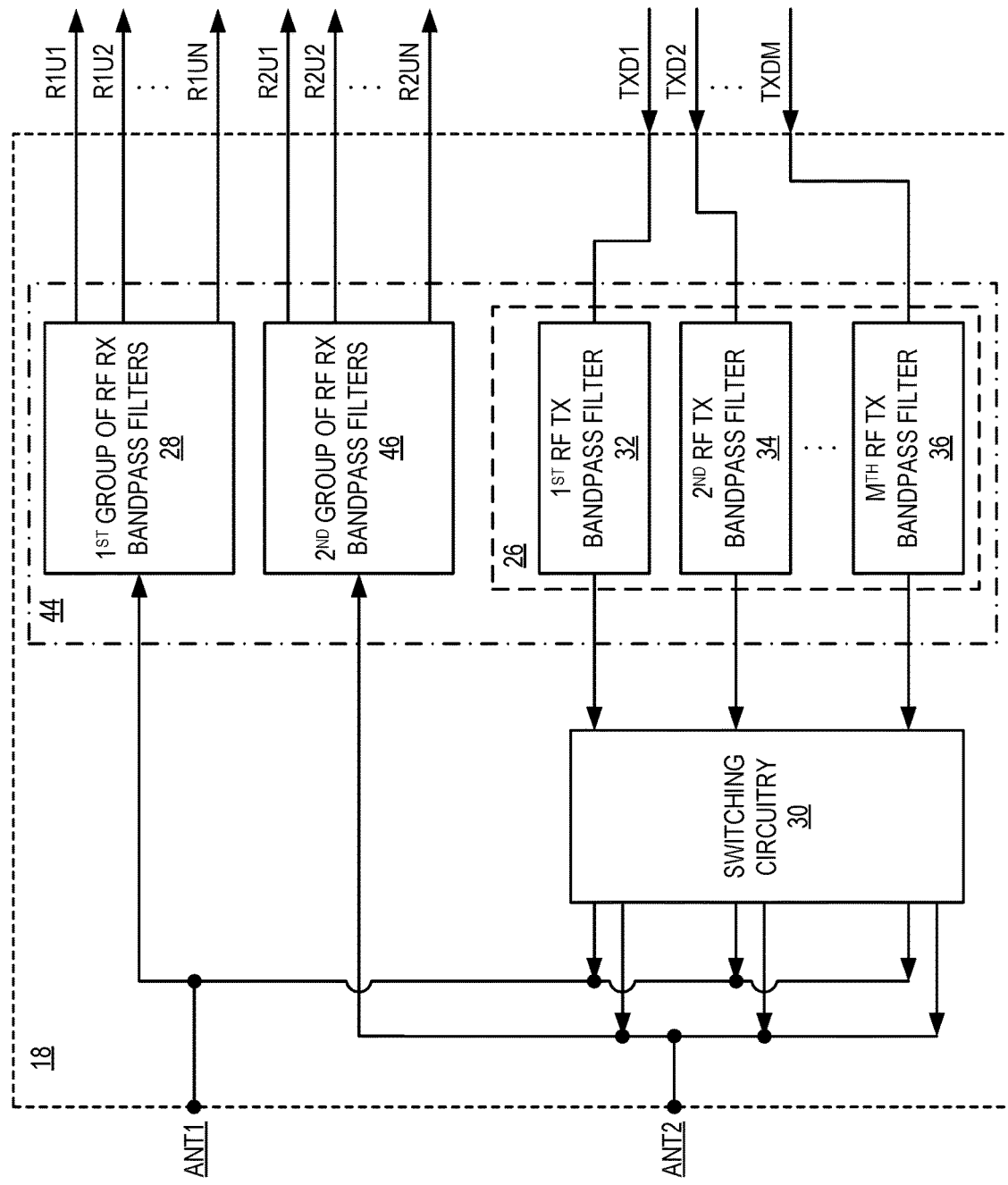
FIG. 2B is a schematic block diagram of an embodiment of the RF TX/RX multiplexer in the RF communications circuitry of FIG. 1B.

FIG. 2B is a schematic block diagram of an embodiment of the RF TX/RX multiplexer 18 in the RF communications circuitry 10 of FIG. 1B. The RF TX/RX multiplexer 18 illustrated in FIG. 2B is similar to the RF TX/RX multiplexer 18 illustrated in FIG. 2A, except the RF TX/RX multiplexer 18 illustrated in FIG. 2B further includes a second group 46 of RF RX bandpass filters. In addition, the RF TX/RX multiplexer 18 has the second antenna node ANT2.

The second group 46 of RF RX bandpass filters is coupled to the second antenna node ANT2. Specifically, each of the second group 46 of RF RX bandpass filters is coupled to the second antenna node ANT2. In addition, the switching circuitry 30 is coupled between the group 26 of RF TX bandpass filters and each of the first antenna node ANT1 and the second antenna node ANT2. In addition, the multiplexing circuit 44 includes the group 26 of RF TX bandpass filters, the first group 28 of RF RX bandpass filters, and the second group 46 of RF RX bandpass filters.

It should be understood that, while the RF TX/RX multiplexer 18 of FIGS. 2A and 2B is particularly described with respect to frequency domain duplexing (FDD) functions, in some embodiments the RF TX/RX multiplexer 18 and filters 32, 34, 36, 38, 40, 42 are additionally or alternatively used for time domain duplexing (TDD) functions. In this regard, the optional switching circuitry 30 can be placed between the antenna node(s) ANT1, ANT2 and both TX filters and RX filters.

FIG. 3A is a circuit diagram of an exemplary generic multiplexing circuit 44 in the RF TX/RX multiplexer 18 of FIG. 2A or 2B. The multiplexing circuit 44 includes one or more connection nodes (e.g., a first connection node CNA and a second connection node CNB) coupled to an antenna node ANT (e.g., connecting to the first antenna node ANT1 and/or the second antenna node ANT2 of FIGS. 1A an 1B). Circuit branches having RF TX and/or RX filters are connected to the one or more connection nodes CNA, CNB. For example, a first branch 48 (which includes a first RF filter 50) and a second branch 52 (which includes a second RF filter 54) are connected to the first connection node CNA. A third branch 56 (which includes a third RF filter 58) and a fourth branch 60 (which includes a fourth RF filter 62) are connected to the second connection node CNB.

Embodiments of the multiplexing circuit 44 can include any number of connection nodes CNA, CNB connected by an inductor-capacitor (LC) tank (e.g., a tank between the first connection node CNA and the second connection node CNB includes a first capacitor C1 and a first inductor L1). Shunt LC tanks connect each connection node to ground (e.g., a first shunt capacitor CS1 and a first shunt inductor LS1 connect the first connection node CNA to ground). In addition, each filter is connected to the corresponding connection node by an LC tank. For example, the first branch 48 includes an LC tank with a first branch capacitor CB1 and a first branch inductor LB1 between the first connection node CNA and the first RF filter 50.

It should be understood that the multiplexing circuit 44 illustrated in FIG. 3A is illustrative in nature, and that embodiments of the multiplexing circuit 44 can be arranged differently and/or include more or fewer elements. For example, in embodiments of the multiplexing circuit 44 many of these elements (e.g., the branches, filters, capacitive elements, and/or inductive elements) have a zero value or are not present.

Figure 3B:
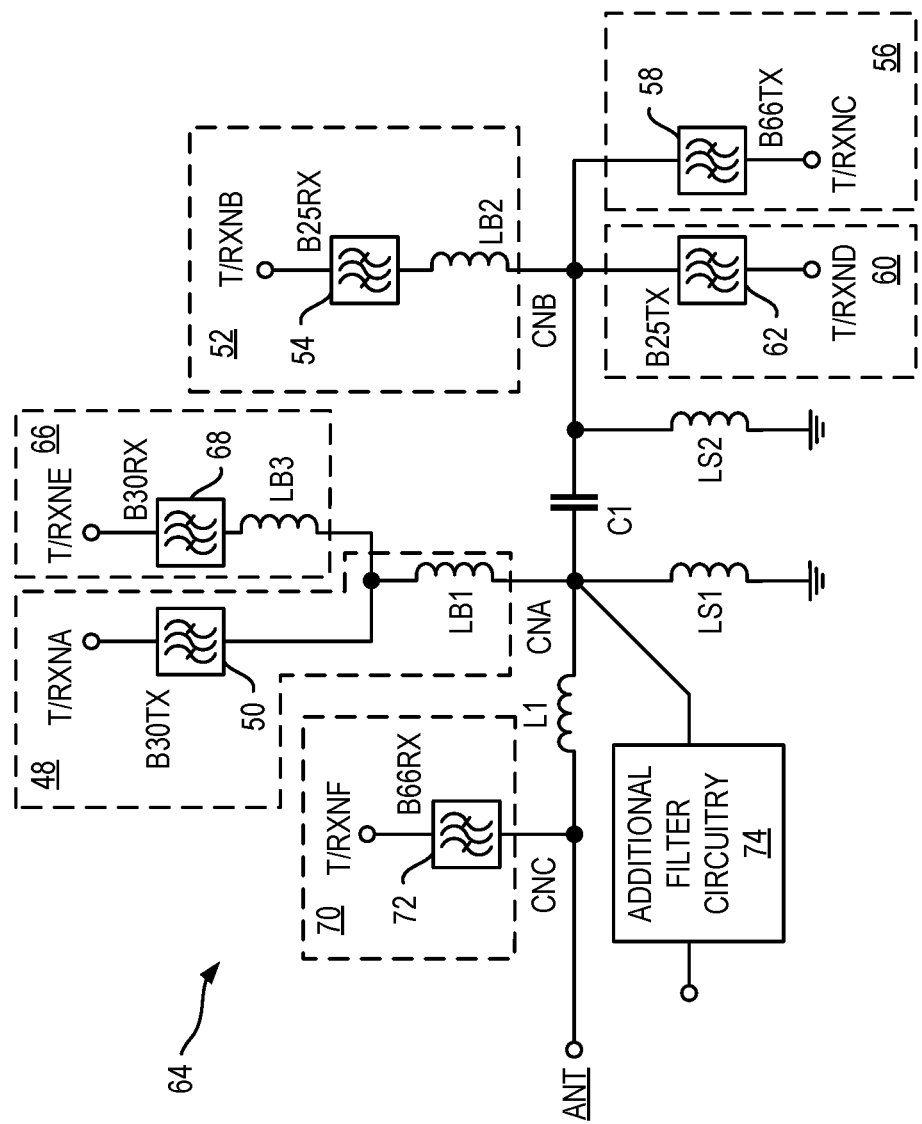
FIG. 3B is a circuit diagram of an exemplary hexaplexer according to the multiplexing circuit of FIG. 3A.

In this regard, FIG. 3B is a circuit diagram of an exemplary hexaplexer 64 according to the multiplexing circuit 44 of FIG. 3A. Only non-zero elements of the hexaplexer 64 are shown. In the hexaplexer 64, the first branch 48 is coupled between the first connection node CNA and a first transceiver node T/RXNA (e.g., coupled to the RF TX circuitry 22 of FIG. 1A). The first branch 48 includes the first branch inductor LB1 between the first connection node CNA and the first RF filter 50 (e.g., a band 30 TX filter). The second branch 52 is coupled between the second connection node CNB and a second transceiver node T/RXNB (e.g., coupled to the RF RX circuitry 20 of FIG. 1A). The second branch 52 includes a second branch inductor LB2 between the second connection node CNB and the second RF filter 54 (e.g., a band 25 RX filter).

The first capacitor C1 is connected in series between the first connection node CNA and the second connection node CNB. The first connection node CNA is coupled to the antenna node ANT via the first inductor L1, and a third connection node CNC is between the antenna node ANT and the first inductor L1.

The multiplexing network of the hexaplexer 64 includes additional branches with filters connected to the first connection node CNA, the second connection node CNB, and the third connection node CNC. The third branch 56 is coupled between the second connection node CNB and a third transceiver node T/RXNC (e.g., coupled to the RF TX circuitry 22 of FIG. 1A), and includes the third RF filter 58 (e.g., a band 66 TX filter). The fourth branch 60 is coupled between the second connection node CNB and a fourth transceiver node T/RXND (e.g., coupled to the RF TX circuitry 22 of FIG. 1A), and includes the fourth RF filter 62 (e.g., a band 25 TX filter).

A fifth branch 66 is coupled between the first connection node CNA and a fifth transceiver node T/RXNE (e.g., coupled to the RF RX circuitry 20 of FIG. 1A). The fifth branch 66 includes a third branch inductor LB3 between the first branch inductor LB1 and a fifth RF filter 68 (e.g., a band 30 RX filter). A sixth branch 70 is coupled between the third connection node CNC and a sixth transceiver node T/RXNF (e.g., coupled to the RF RX circuitry 20 of FIG. 1A), and includes a sixth RF filter 72 (e.g., a band 66 RX filter).

The first connection node CNA is connected to ground via a first shunt inductor LS1, and the second connection node CNB is connected to ground via a second shunt inductor LS2. In an exemplary aspect, additional filter circuitry 74 is coupled to the first connection node CNA, which may include an additional switched multiplexer network (e.g., a diplexer with band 7 filters and a TDD band 41 TX/RX filter).

Figure 4A:
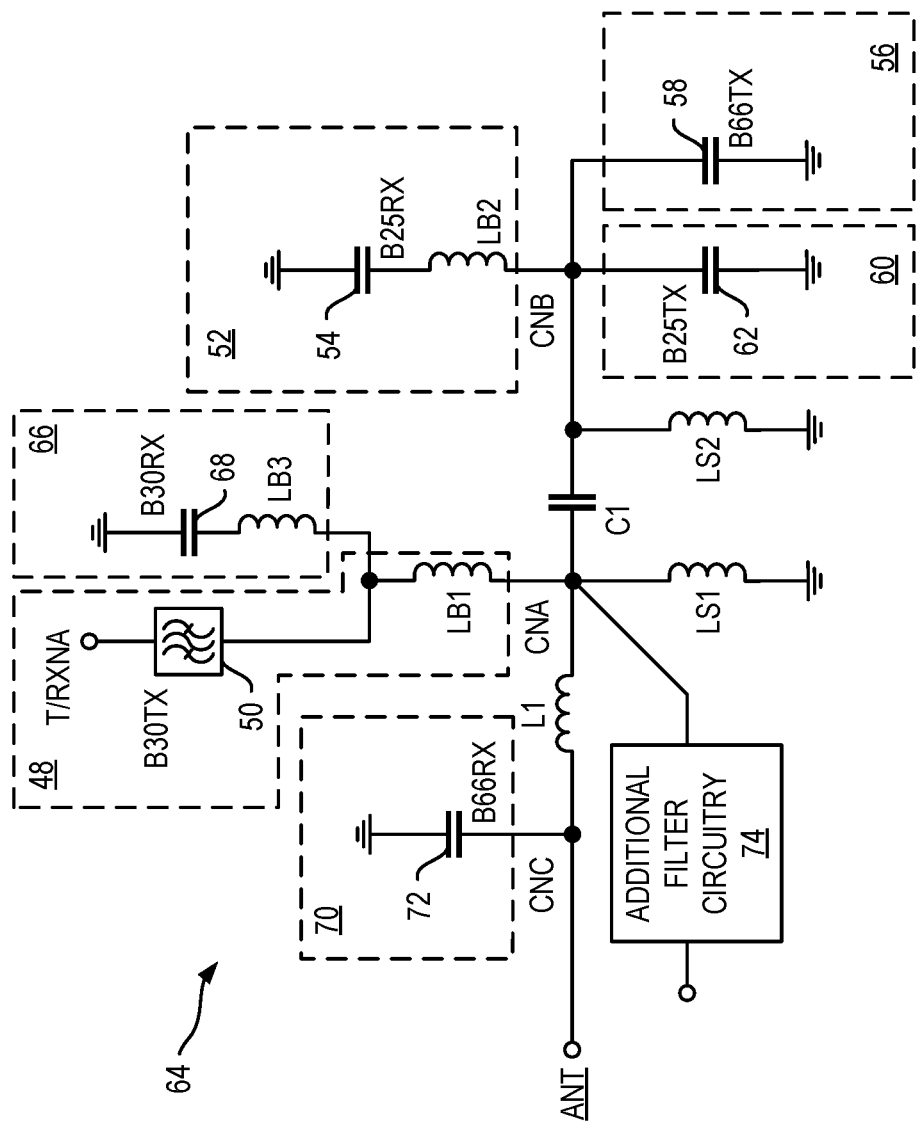
FIG. 4A illustrates an equivalent circuit of the hexaplexer of FIG. 3B at a first frequency range (e.g., band 30 TX).
Figure 4B:
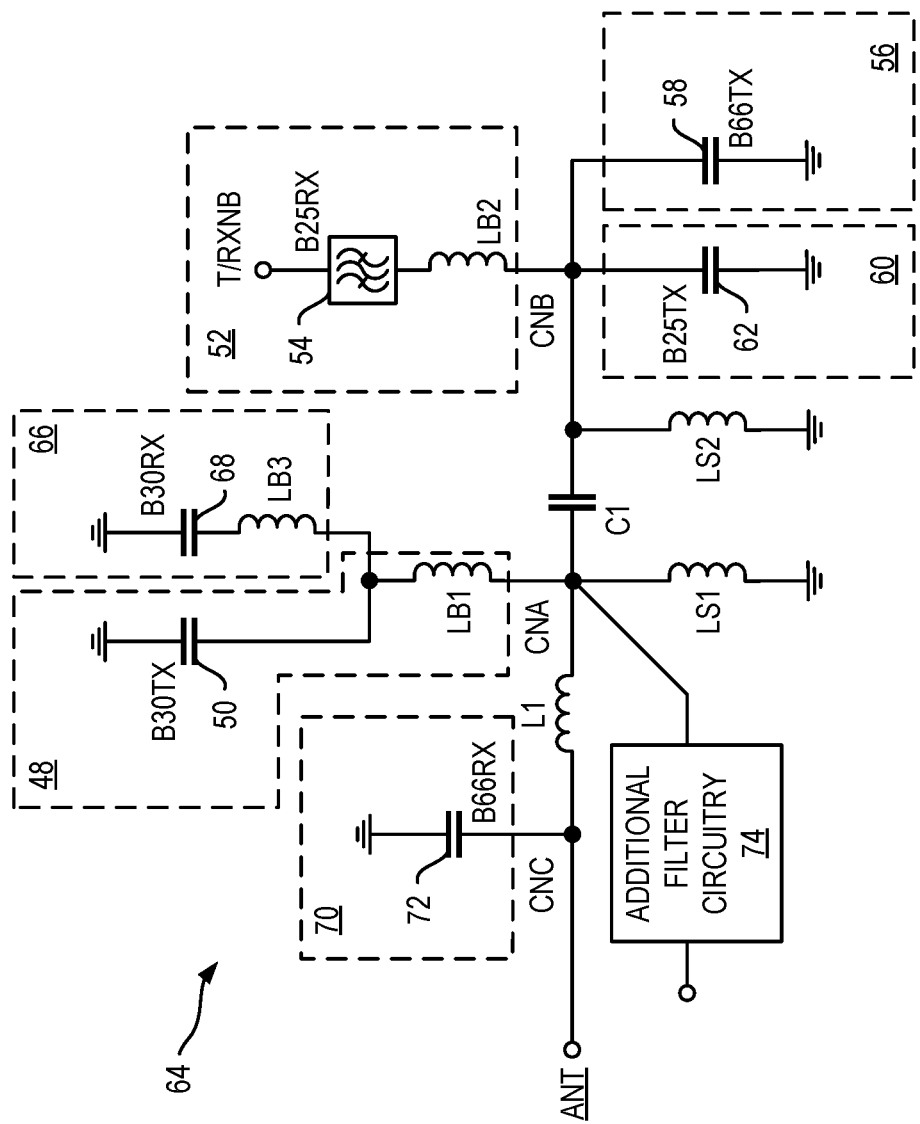
FIG. 4B is a circuit diagram of an equivalent circuit of the hexaplexer of FIG. 3B at a second frequency range (e.g., band 25 RX).

As illustrated with respect to FIGS. 4A and 4B, one critical aspect of multiplexer design is the loading of the filters to each other. FIG. 4A illustrates an equivalent circuit of the hexaplexer 64 of FIG. 3B at a first frequency range (e.g., band 30 TX). FIG. 4B is a circuit diagram of an equivalent circuit of the hexaplexer 64 of FIG. 3B at a second frequency range (e.g., band 25 RX). The equivalent shunt capacitance a filter presents out-of-band is commonly referred to as static or equivalent capacitance and plays a critical role in multiplexer design. On the one hand, a high static capacitance benefits the filter performance for that particular band. On the other hand, a low static capacitance benefits the performance of the other bands in the multiplexer as it increases the impedance the multiplexer presents to the other filters at their interface. Thus, balancing the static capacitances of each filter in the network is of great importance as they all load each other.

Figure 5A:
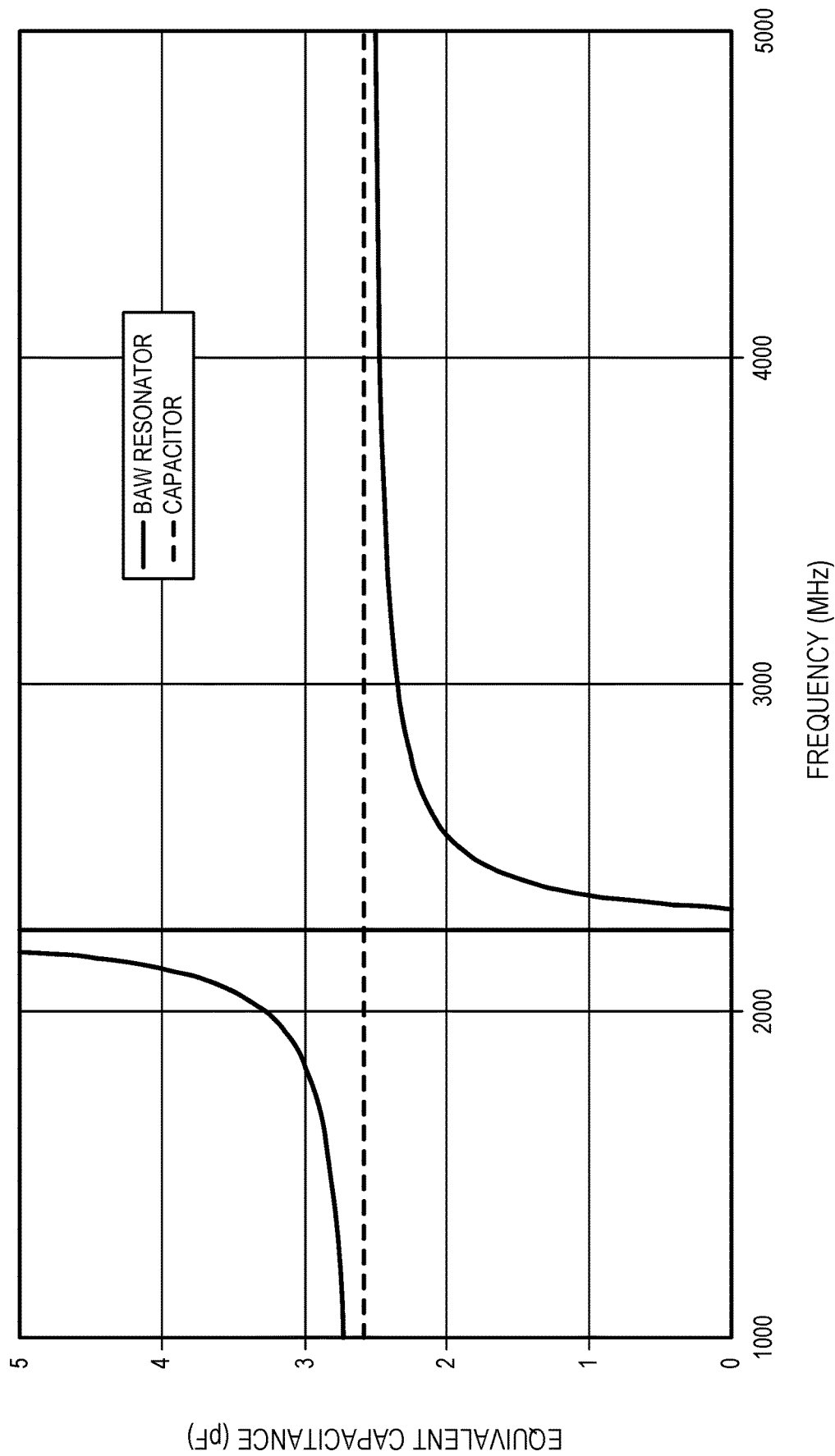
FIG. 5A is a graphical representation of equivalent capacitance of a bulk acoustic wave (BAW) resonator compared with a capacitor as a function of frequency.
Figure 5B:
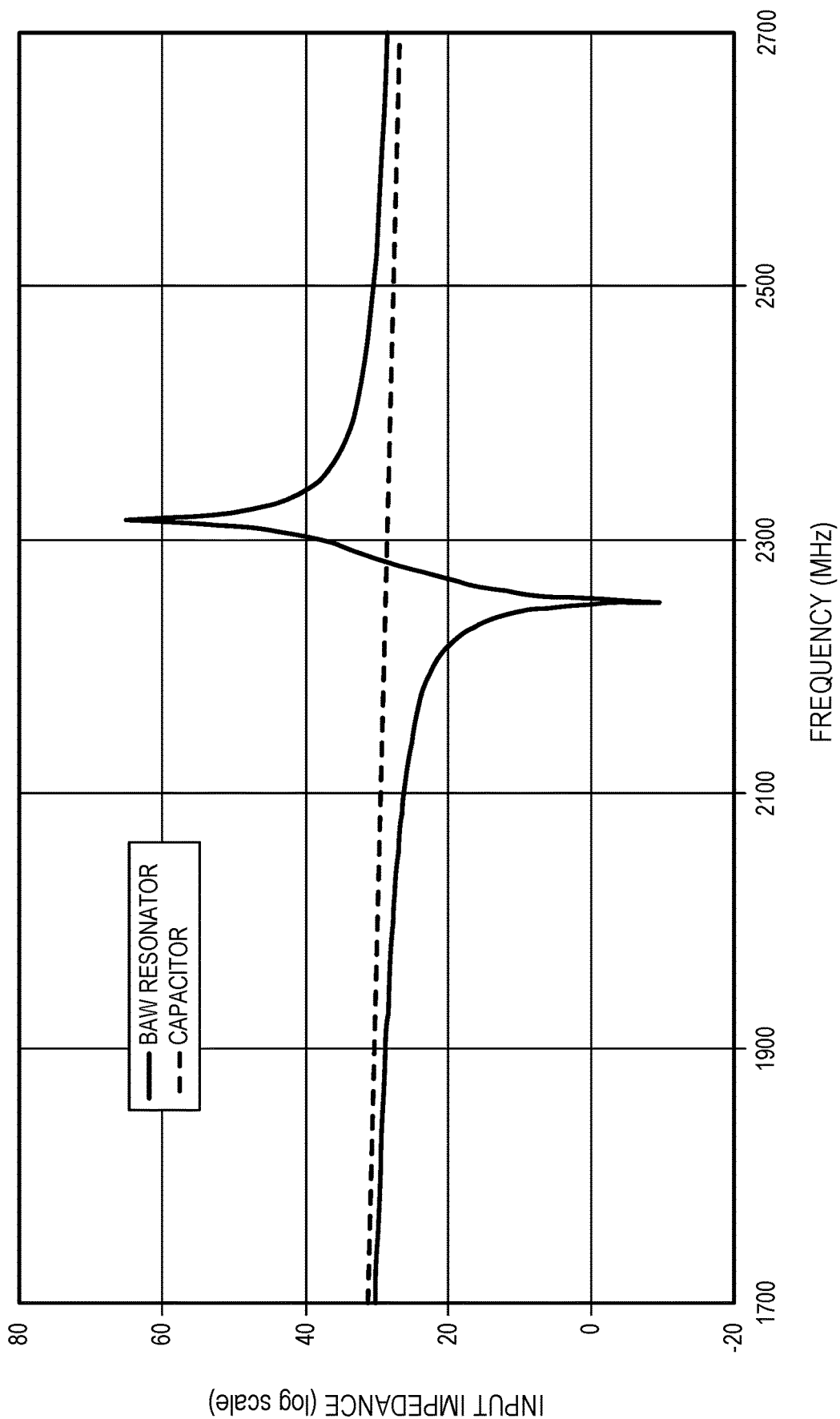
FIG. 5B is a graphical representation of input impedance of the BAW resonator compared with the capacitor as a function of frequency.

Embodiments described herein introduce one or more BAW resonators as multiplexing network elements to provide isolation between filters or otherwise improve performance of one or more filters. In a first approximation, a BAW filter can be understood as a shunt capacitor out of band and a lossy short circuit in-band as BAW resonators function as a frequency dependent capacitor featuring a zero and a pole. FIGS. 5A and 5B illustrate these properties.

FIG. 5A is a graphical representation of equivalent capacitance of a BAW resonator compared with a capacitor as a function of frequency. One can see that the equivalent capacitance of a BAW resonator is slightly higher at lower frequencies and lower at higher frequencies.

FIG. 5B is a graphical representation of input impedance of the BAW resonator compared with the capacitor as a function of frequency. At resonance, a BAW resonator presents very low impedance and at the anti-resonance it has a very high impedance.

With continuing reference to FIGS. 5A and 5B, these properties make BAW resonators interesting elements to be used in multiplexing networks. First, the frequency dependent capacitance value is advantageous in cases where, for instance, lower frequency multiplexed bands benefit from a higher capacitance value while higher frequency bands benefit from a lower value. When using a capacitor, its value will typically be a compromise between these two cases, but a BAW resonator can come closer to an optimal solution. Second, the resonance and anti-resonance can be used to produce high-Q open- and short-circuits that have several applications.

Figure 6A:
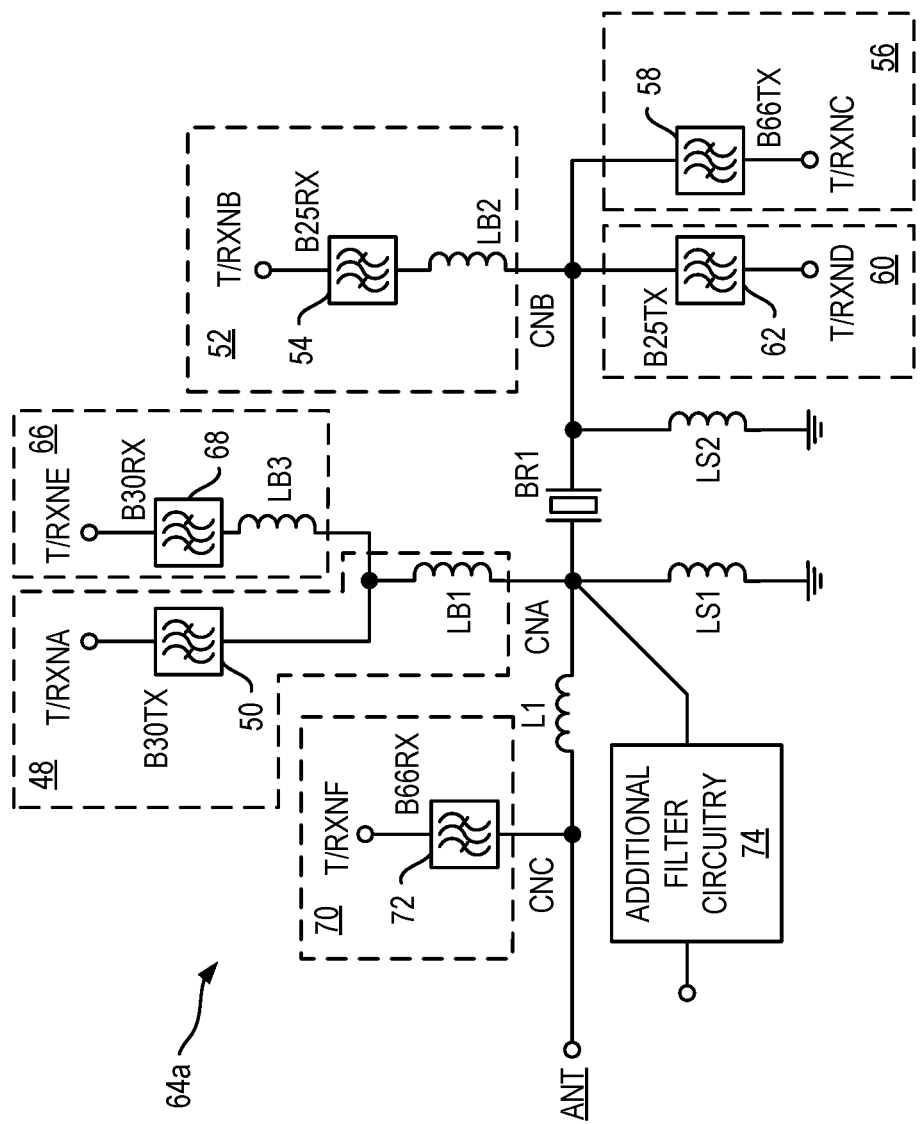
FIG. 6A is a circuit diagram of another exemplary hexaplexer replacing a first capacitor in series between a first branch and a second branch with a first BAW resonator according to embodiments described herein.

FIG. 6A is a circuit diagram of another exemplary hexaplexer 64a replacing the first capacitor C1 in series between the first branch 48 and the second branch 52 with a first BAW resonator BR1 according to embodiments described herein. This provides an example of using a BAW resonator in a multiplexing network to provide isolation between the first branch 48 and the second branch 52 at a range of interest and otherwise improve performance of the hexaplexer 64a.

Figure 6B:
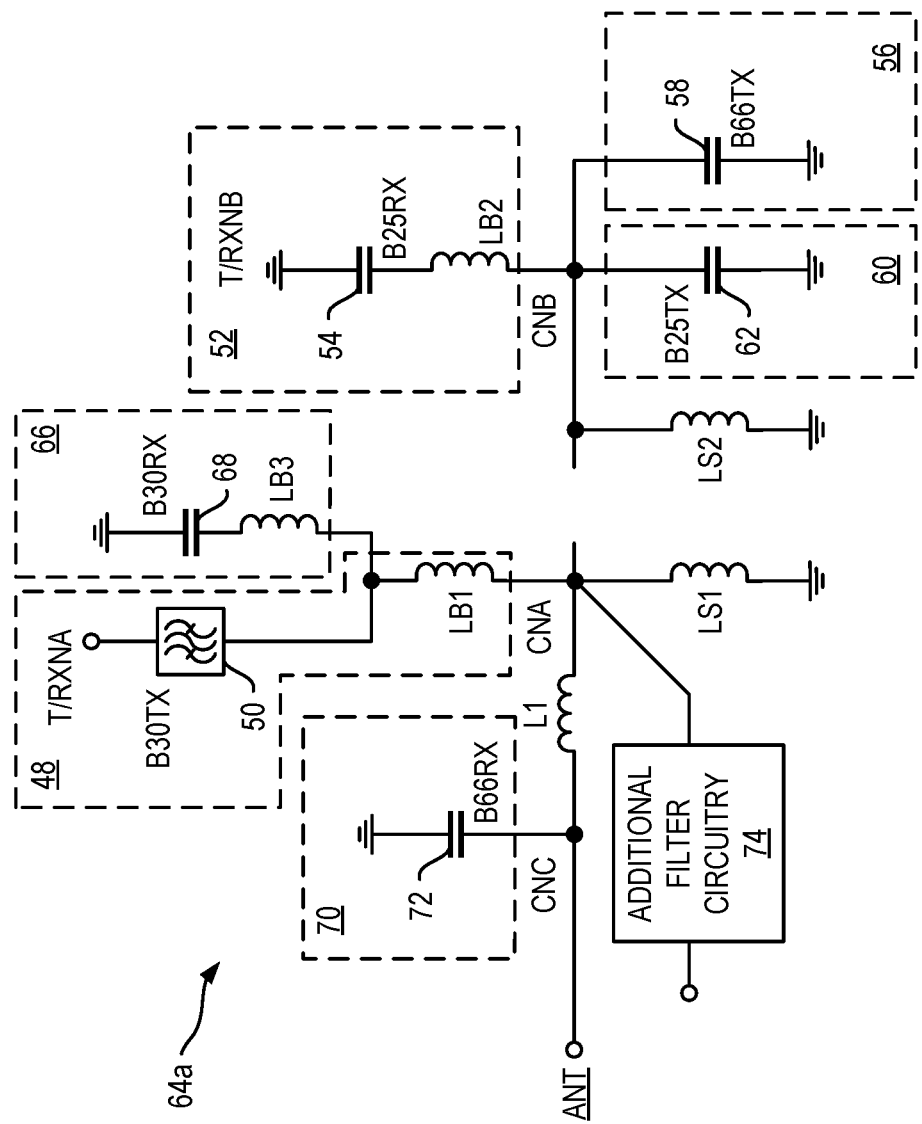
FIG. 6B illustrates an equivalent circuit of the hexaplexer of FIG. 6A at a first frequency range of interest (e.g., band 30 TX).

FIG. 6B illustrates an equivalent circuit of the hexaplexer 64a of FIG. 6A at a first frequency range of interest (e.g., band 30 TX). As shown in FIG. 6B, if the anti-resonance (high-impedance) of the first BAW resonator BR1 is set to the band 30 TX frequencies (e.g., the passband of the first RF filter 50), the second connection node CNB will be effectively disconnected from the first connection node CNA at those frequencies. This has two immediate consequences. First, it reduces or negates the loading effect from the second RF filter 54 (band 25 RX), the third RF filter 58 (band 66 TX), and other filter(s) (e.g., band 66 TX) connected to the second connection node CNB, improving the power gain of the first RF filter 50 (band 30 TX). Second, it will generate a notch that improves isolation to the second RF filter 54 from the first RF filter 50.

The hexaplexer 64 design of FIG. 3B is used herein as a reference to show the effects of replacing an element of a multiplexing network (e.g., the first capacitor C1) with a BAW resonator (e.g., the first BAW resonator BR1). The advantages of the hexaplexer 64a of FIG. 6A with the BAW resonator over the hexaplexer 64 of FIG. 3B are further illustrated with respect to FIGS. 7A-7D.

Figure 7A:
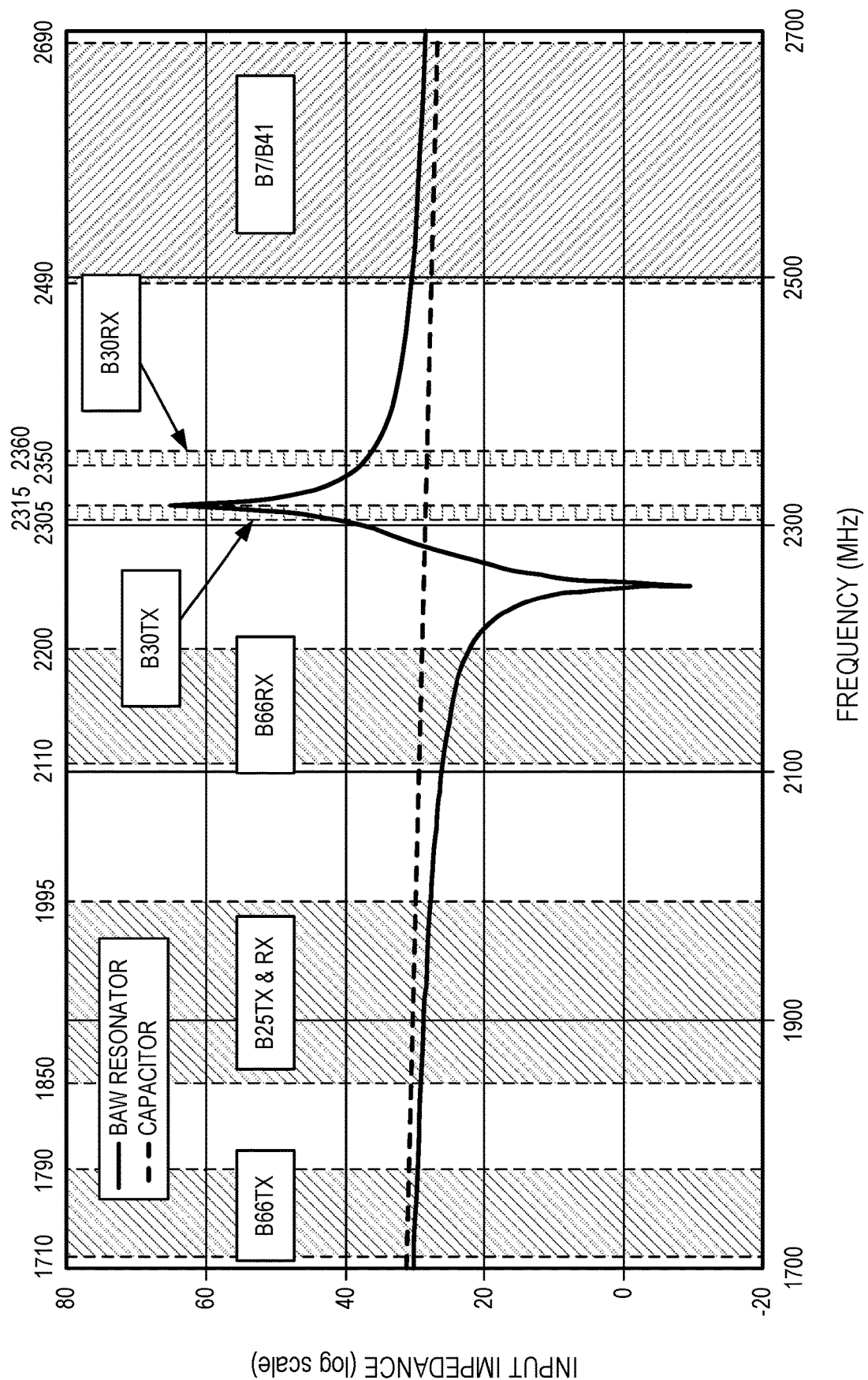
FIG. 7A is a graphical representation of input impedance of the first BAW resonator in the hexaplexer of FIG. 6A as a function of frequency compared to a capacitor.
Figure 7B:
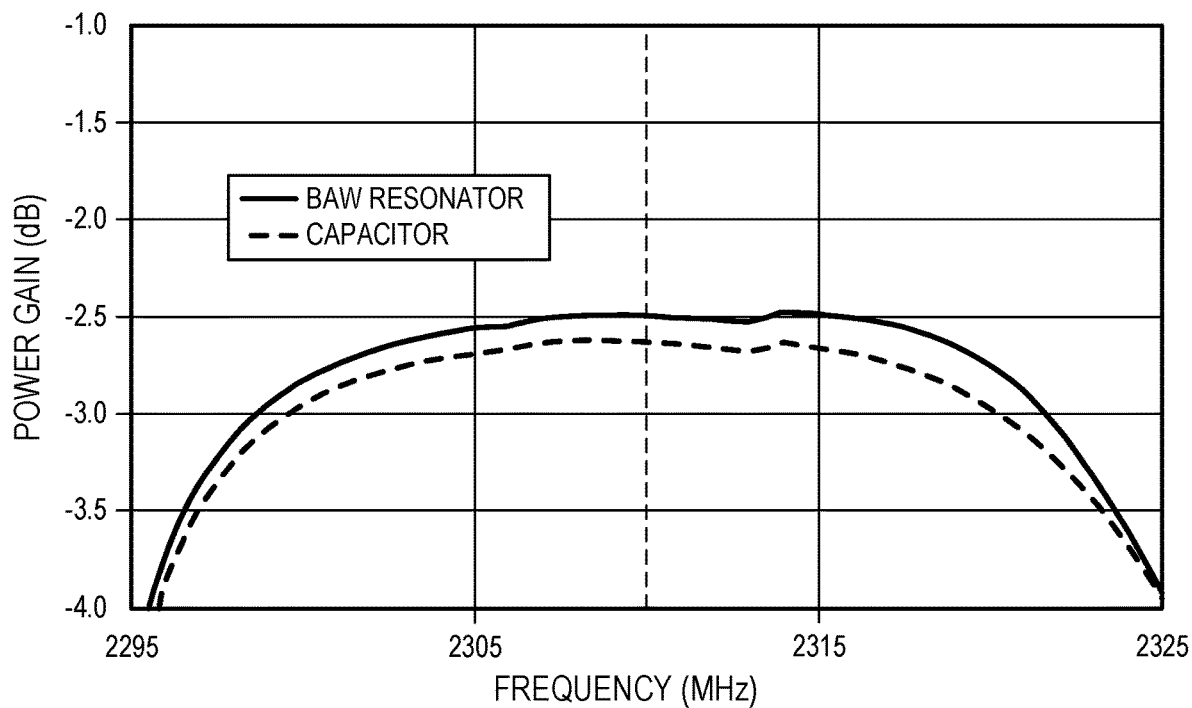
FIG. 7B is a graphical representation of power gain of the first RF filter in the hexaplexer of FIG. 6A as a function of frequency compared to the hexaplexer of FIG. 3B.
Figure 7C:
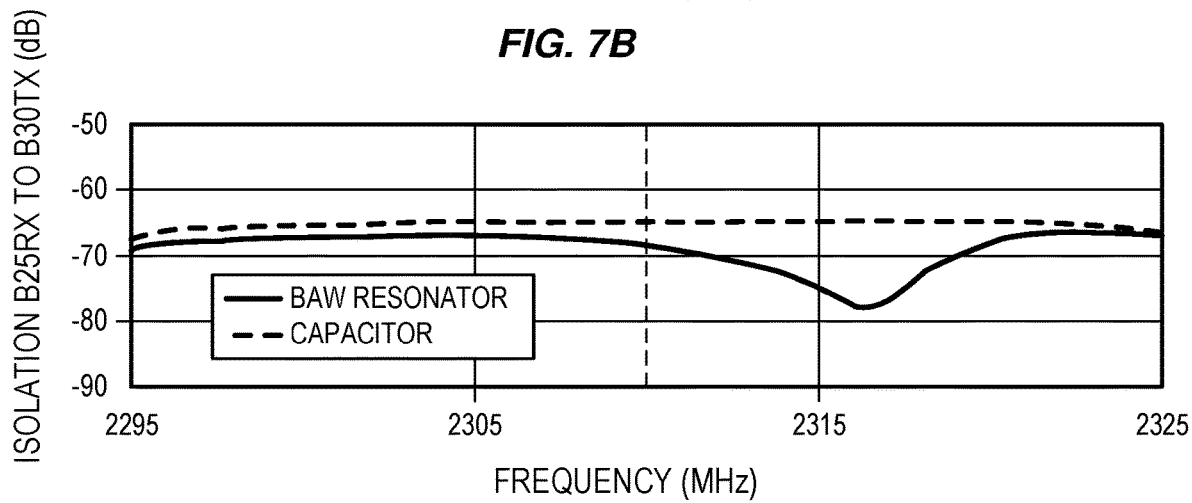
FIG. 7C is a graphical representation of isolation between the second RF filter and the first RF filter in the hexaplexer of FIG. 6A as a function of frequency compared to the hexaplexer of FIG. 3B.
Figure 7D:
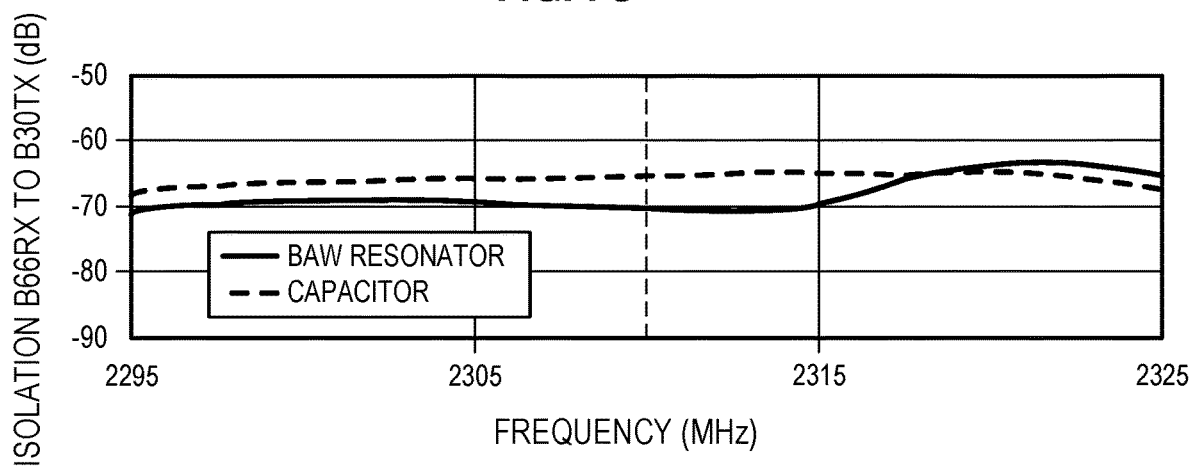
FIG. 7D is a graphical representation of isolation between the sixth RF filter and the first RF filter in the hexaplexer of FIG. 6A as a function of frequency compared to the hexaplexer of FIG. 3B.

FIG. 7A is a graphical representation of input impedance of the first BAW resonator BR1 in the hexaplexer 64a of FIG. 6A as a function of frequency compared to a capacitor. FIG. 7B is a graphical representation of power gain of the first RF filter 50 in the hexaplexer 64a of FIG. 6A as a function of frequency compared to the hexaplexer 64 of FIG. 3B. FIG. 7C is a graphical representation of isolation between the second RF filter 54 and the first RF filter 50 in the hexaplexer 64a of FIG. 6A as a function of frequency compared to the hexaplexer 64 of FIG. 3B. FIG. 7D is a graphical representation of isolation between the sixth RF filter 72 and the first RF filter 50 in the hexaplexer 64a of FIG. 6A as a function of frequency compared to the hexaplexer 64 of FIG. 3B.

As shown in FIG. 7A, the anti-resonance of the first BAW resonator BR1 is centered slightly above the band 30 TX frequencies. When doing so, the power gain of the first RF filter 50 (e.g., band 30 TX) improves around 0.2 dB, as shown in FIG. 7B. In addition, the isolation of the second RF filter 54 (band 25 RX) and the isolation of the sixth RF filter 72 (band 66 RX) at band 30 TX frequencies also improve by 5 to 10 dB as shown in FIGS. 7C and 7D.

Figure 8A:
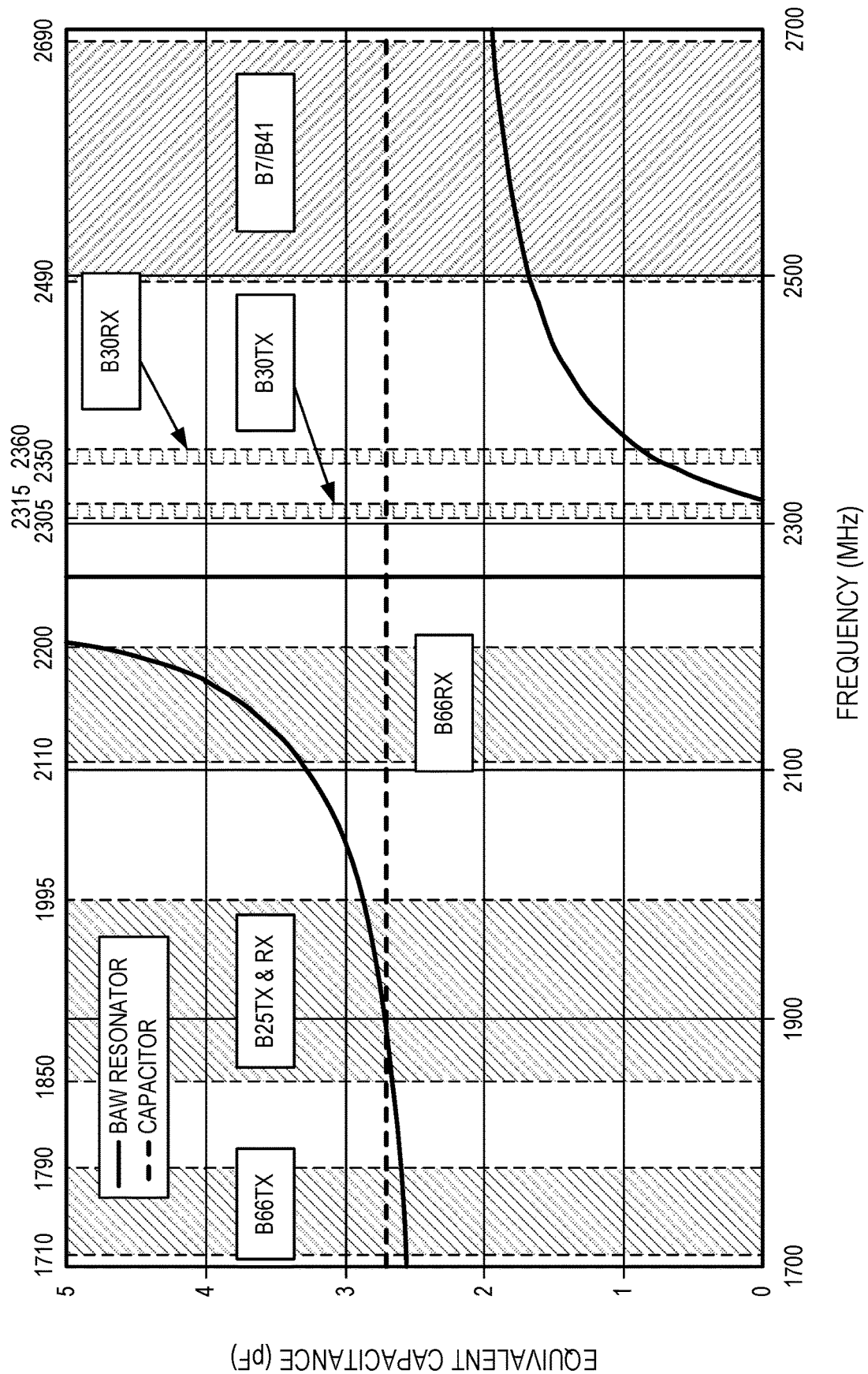
FIG. 8A is a graphical representation of equivalent capacitance of the first BAW resonator in the hexaplexer of FIG. 6A as a function of frequency compared to a capacitor.
Figure 8B:
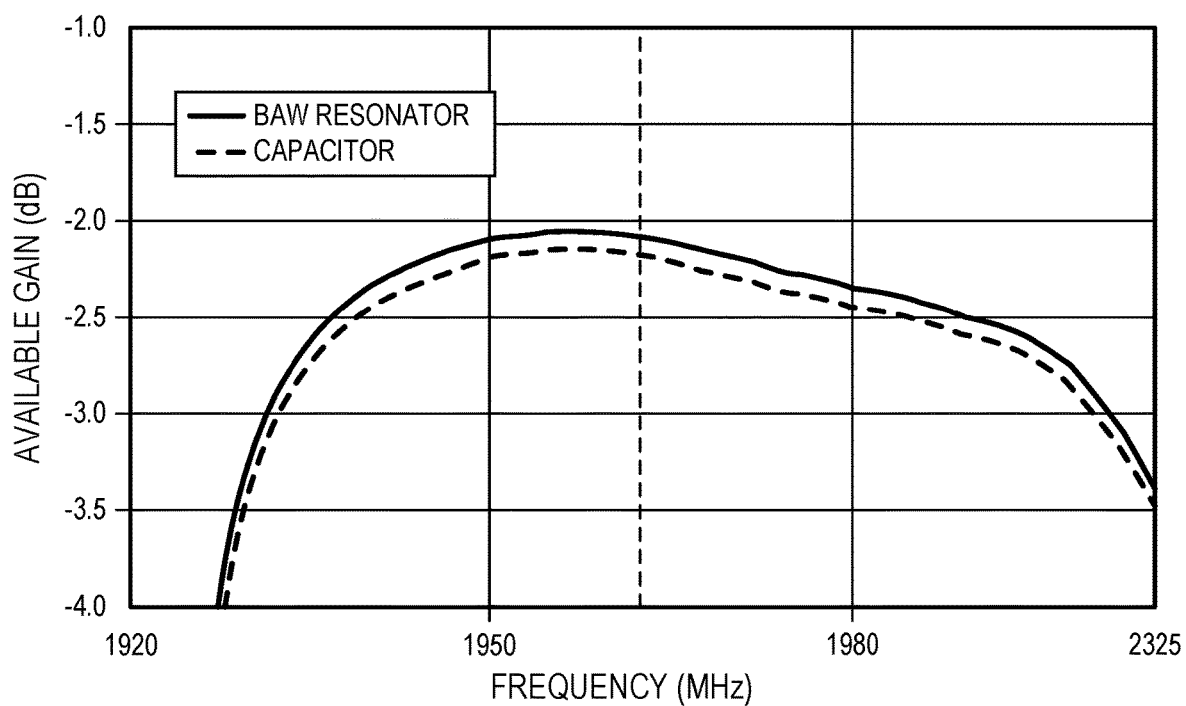
FIG. 8B is a graphical representation of available gain of the second RF filter in the hexaplexer of FIG. 6A as a function of frequency compared to the hexaplexer of FIG. 3B.
Figure 8C:
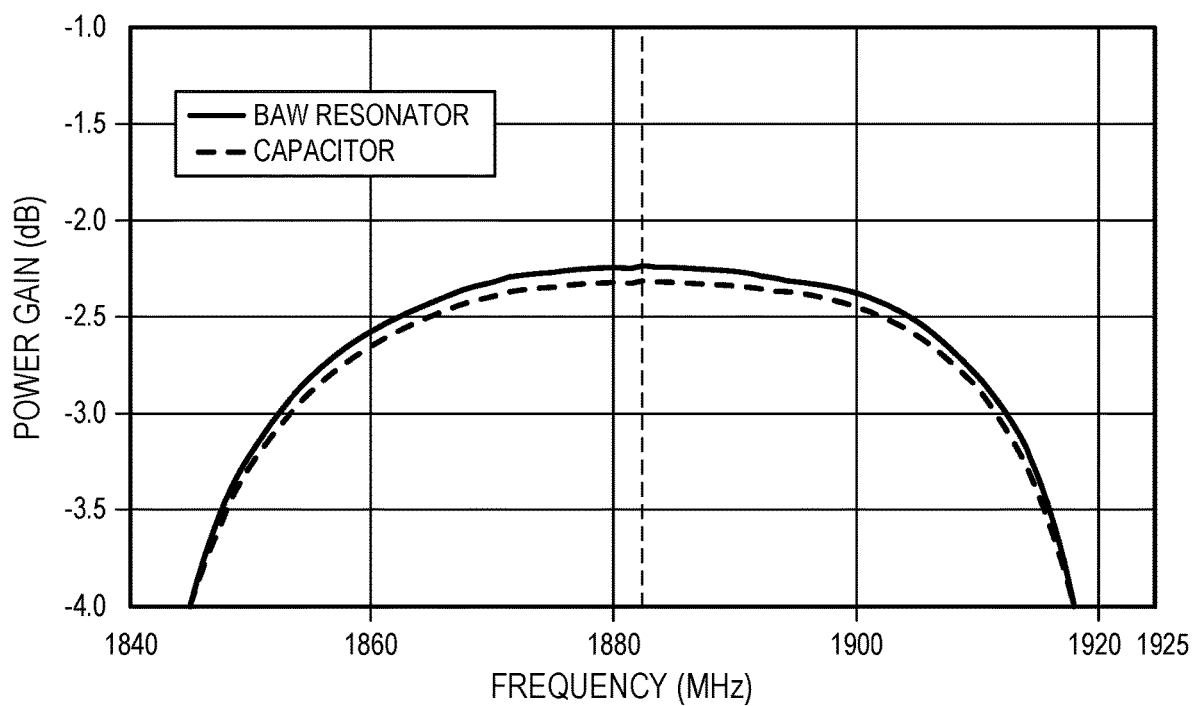
FIG. 8C is a graphical representation of power gain of the fourth RF filter in the hexaplexer of FIG. 6A as a function of frequency compared to the hexaplexer of FIG. 3B.

FIG. 8A is a graphical representation of equivalent capacitance of the first BAW resonator BR1 in the hexaplexer 64a of FIG. 6A as a function of frequency compared to a capacitor. FIG. 8B is a graphical representation of available gain of the second RF filter 54 in the hexaplexer 64a of FIG. 6A as a function of frequency compared to the hexaplexer 64 of FIG. 3B. FIG. 8C is a graphical representation of power gain of the fourth RF filter 62 in the hexaplexer 64a of FIG. 6A as a function of frequency compared to the hexaplexer 64 of FIG. 3B.

Once the frequency position of a BAW resonator used in a multiplexer network is set, its frequency-dependent capacitance can be exploited to improve the other bands in the multiplexer. For example, with reference to the hexaplexer 64a of FIG. 6A and FIGS. 8A-8C, a quick optimization of the area of the first BAW resonator BR1 yields close to a 0.1 dB loss improvement for the second RF filter 54 (band 25 RX), the fourth RF filter 62 (band 25 TX), and the sixth RF filter 72 (band 66 RX) and slightly less than that for the third RF filter 58 (band 66 TX) whose impedance variation is reduced by 10%. High-bands (e.g., band 7 and band 41) in the additional filter circuitry 74 show some marginal improvement in the 0.05 dB range.

Overall, on top of the 0.2 dB improvement for the first RF filter 50 (band 30 TX), around 0.3 dB loss improvement is achieved for the mid-bands and 0.1 dB for the high-bands. The sixth RF filter 72 (band 66 RX) benefits from an increased value of the capacitance, while band 7 and band 41 in the additional filter circuitry 74 see a lower value, as illustrated in FIG. 8A. In an exemplary aspect, caution should be exercised when including BAW resonators in multiplexing networks to avoid performance degradation due to border ring modes or self-generated second harmonic signals. Well known design best practices, such as resonator splitting and border ring optimization, can be used to reduce or negate such effects.

The hexaplexer 64a embodiment described with respect to FIGS. 6A-8C is illustrative of improvements which can be made to existing multiplexing network designs using BAW resonators. It should be understood that these principles can be extended generically to other multiplexing circuits 44, such as described below with respect to FIGS. 9-12.

Figure 9:
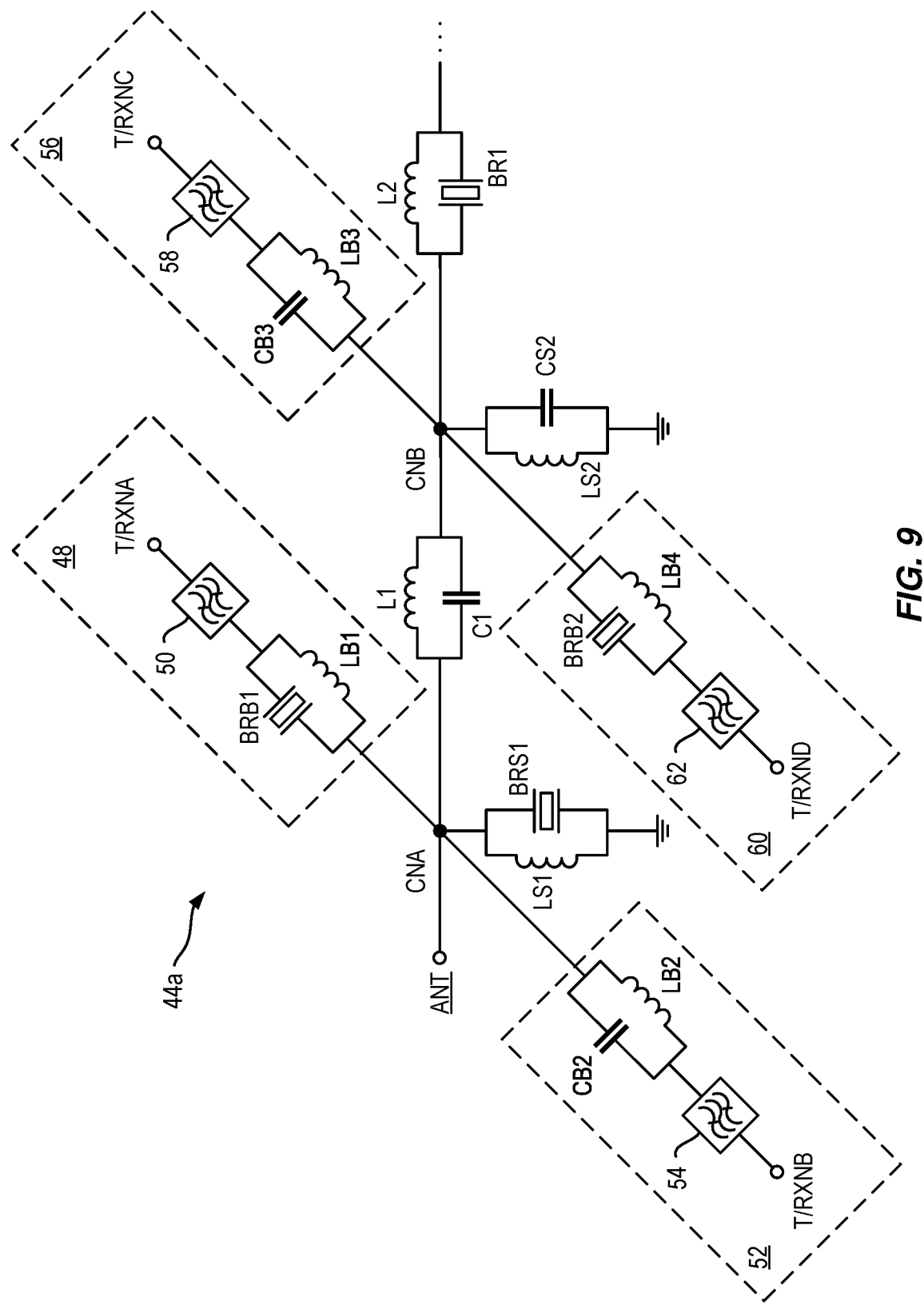
FIG. 9 is a circuit diagram of an exemplary generic multiplexing circuit having one or more BAW resonators for improving performance of the multiplexing network, according to embodiments described herein.

In this regard, FIG. 9 is a circuit diagram of another exemplary generic multiplexing circuit 44a having one or more BAW resonators BR1, BRB1, BRB2, BRS1 for improving performance of the multiplexing network, according to embodiments described herein. Similar to FIG. 3A, the multiplexing circuit 44a includes one or more connection nodes CNA, CNB coupled to an antenna node ANT. The BAW resonators BR1, BRB1, BRB2, BRS1 can be set at different resonant frequencies and capacitance values to provide various benefits to different elements in the multiplexing circuit 44a. In this regard, the BAW resonators BR1, BRB1, BRB2, BRS1 which are used to enhance multiplexing performance are not restricted to resonate at a filtering frequency (e.g., as would be the case if the BAW resonators were part of an RF filter 50, 54, 58, 62), but can be set to resonate at any other frequency which enhances multiplexing performance. For example, the first BAW resonator BR1 in the first branch 48 need not resonate at a filtering frequency of the first RF filter 50.

For example, the first BAW resonator BR1 can be coupled between the second connection node CNB and other connection nodes. The first branch 48 (between the first connection node CNA and the first transceiver node T/RXNA) includes a first branch BAW resonator BRB1 between the first connection node CNA and the first RF filter 50 (e.g., as an LC tank with the first branch inductor LB1). The fourth branch 60 (between the second connection node CNB and the fourth transceiver node T/RXND) includes a second branch BAW resonator BRB2 between the second connection node CNB and the fourth RF filter 62 (e.g., as an LC tank with the fourth branch inductor LB4). A first shunt BAW resonator BRS1 is connected in shunt between the first connection node CNA and ground (e.g., as an LC tank with the first shunt inductor LS1). Similar to FIG. 3A, in embodiments of the multiplexing circuit 44a many of these elements (e.g., the branches, filters, capacitive elements, and/or inductive elements) have a zero value or are not present.

There are many cases where the resonance, anti-resonance, and frequency-dependent capacitance of the BAW resonators BR1, BRB1, BRB2, BRS1 could be used. For example, they could be used to suppress second harmonic signals (H2) generated in the RF filters 50, 54, 58, 62 or troublesome intermodulation distortion (IMD) cases in network topologies such as the hexaplexer 64a of FIG. 6A.

In practice, implementing BAW resonators BR1, BRB1, BRB2, BRS1 as multiplexing network elements as described above may not be straightforward. In some embodiments, the multiplexing BAW resonator(s) BR1, BRB1, BRB2, BRS1 are put in a BAW filter die along with one or more of the RF filters 50, 54, 58, 62 in the multiplexing network 44a. However, factors like resonator resonant frequency and layout placement can create a number of challenges.

In this regard, some embodiments alternatively implement one or more of the BAW resonators BR1, BRB1, BRB2, BRS1 in an independent die. For example, a BAW resonator can be implemented in anti-parallel configuration using two connection bumps (e.g., solder bumps) as a surface mount device (SMD) incorporated in an RF module. Using this BAW SMD, great versatility is achieved both in terms of adjusting the resonant frequency and the capacitance of the resonator. Additional bumps (e.g., a three-bump die) may be used as well (e.g., if mechanical stability is a concern).

Figure 10:
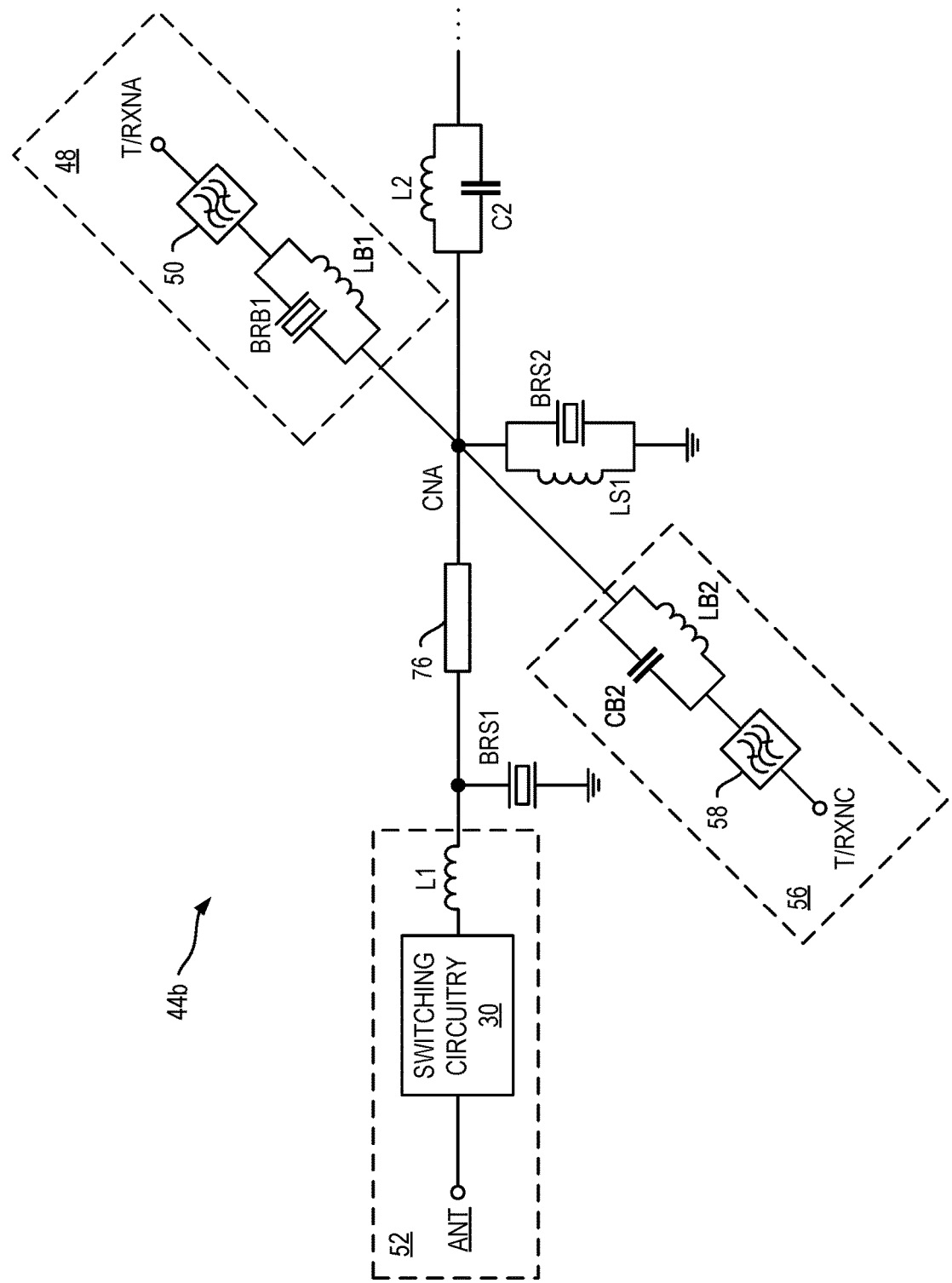
FIG. 10 is a circuit diagram of another exemplary generic multiplexing circuit having a BAW resonator connected in shunt with the multiplexing network.

FIG. 10 is a circuit diagram of another exemplary generic multiplexing circuit 44b located at a distance from the antenna node ANT, represented with a transmission line 76. In some examples, an LC network is placed near the switching circuitry 30 to add tunability and compensate for impedance deviations in the multiplexing circuit 44b (e.g., after fabrication and/or due to distance as represented with the transmission line 76). Here, the LC network includes a first inductor L1 and a first shunt BAW resonator BRS1 (connected in shunt between the first connection node CNA and the first inductor L1) in place of a capacitor to implement a high-Q transmission notch and/or provide frequency-dependent capacitance. In this manner, the first shunt BAW resonator BRS1 is coupled to the first connection node CNA and configured to compensate for impedance in the multiplexing circuit 44b (e.g., from the second branch 52 comprising the switching circuitry 30 and the antenna node ANT, from the first branch 48 comprising the first RF filter 50, and/or from the third branch 56 comprising the third RF filter 58 using the frequency-dependent capacitance of the first shunt BAW resonator BRS1. In other examples, such impedance compensation may be provided through different arrangements of the BAW resonator BRS1, including in series between branches of the multiplexing circuit 44b.

Figure 11:
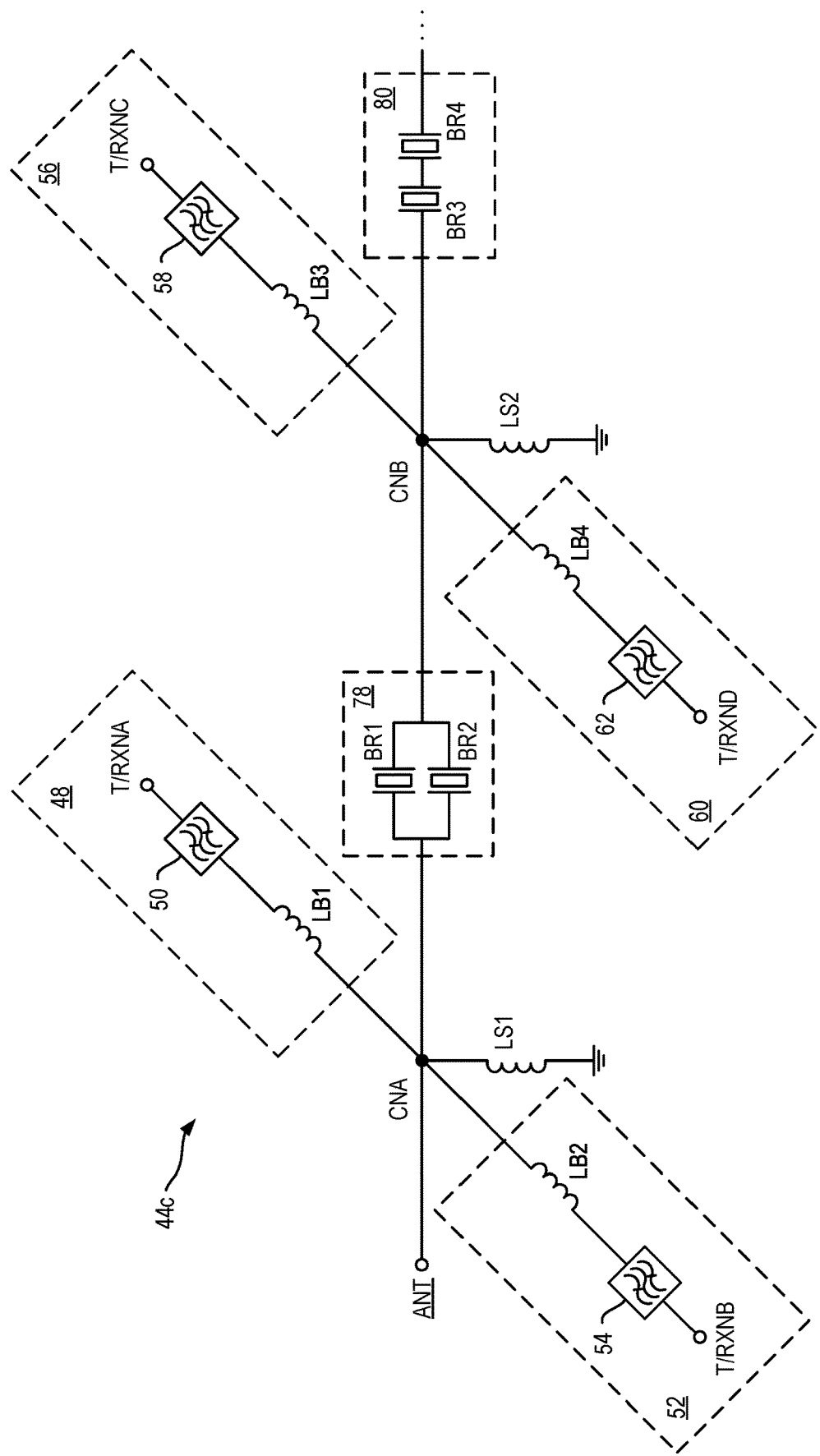
FIG. 11 is a circuit diagram of another exemplary generic multiplexing circuit having one or more BAW resonator pairs coupled in series or in parallel with one another in the multiplexing network.

FIG. 11 is a circuit diagram of another exemplary generic multiplexing circuit 44c having one or more BAW resonator pairs 78, 80 coupled in series or in parallel with one another in the multiplexing network. In some embodiments, the multiplexing circuit 44c includes one or more parallel BAW resonator pairs 78 (e.g., with a first BAW resonator BR1 connected in parallel with a second BAW resonator BR2 between the first connection node CNA and the second connection node CNB) and/or series BAW resonator pairs 80 (e.g., with a third BAW resonator BR3 connected in series with a third BAW resonator BR4 between the second connection node CNA and another connection node).

In an exemplary aspect, each resonator in a given BAW resonator pair 78, 80 has a different resonator/anti-resonator frequency and/or area in order to provide distinct advantages. In this manner, a more complex response profile can be provided, such as illustrated in FIG. 12.

Figure 12:
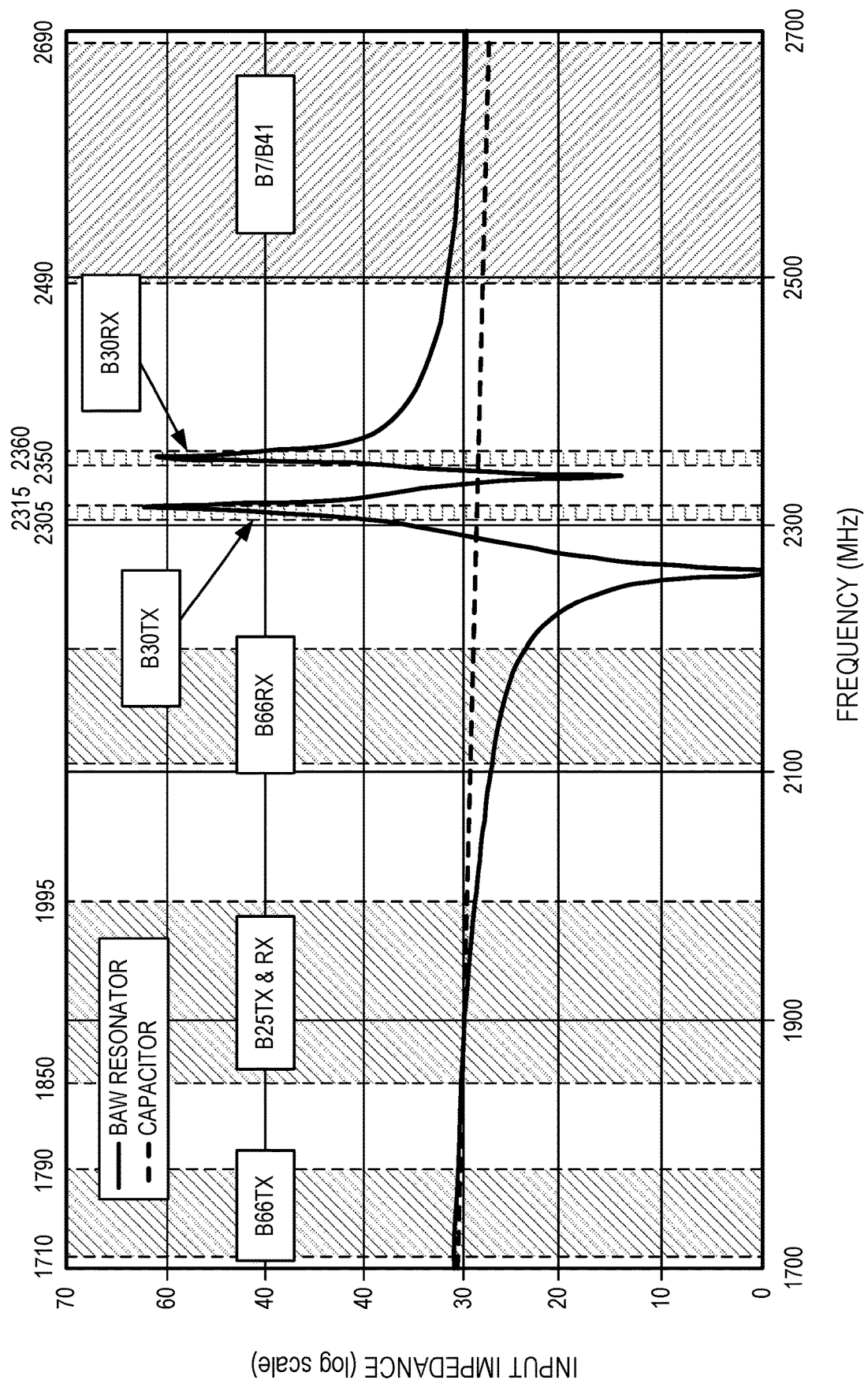
FIG. 12 is a graphical representation of input impedance of the series BAW resonator pair in the multiplexing circuit of FIG. 11 as a function of frequency.

FIG. 12 is a graphical representation of input impedance of the series BAW resonator pair 80 in the multiplexing circuit 44c of FIG. 11 as a function of frequency. In the example illustrated, the interesting impedance profile of the series configuration has two pairs of poles and zeros. This can provide several advantages, such as providing isolation between branches of the multiplexing circuit 44c at two frequency ranges of interest (e.g., at band 30 TX and band 30 RX) due to the anti-resonances of the series BAW resonator pair 80.

Those skilled in the art will recognize improvements and modifications to the preferred embodiments of the present disclosure. All such improvements and modifications are considered within the scope of the concepts disclosed herein and the claims that follow.

What is claimed is:

1. A multiplexing circuit, comprising:
an antenna node configured to couple to a radio frequency (RF) antenna;
a plurality of transceiver nodes configured to couple to transceiver circuitry; and
multiplexing circuitry coupled between the antenna node and the plurality of transceiver nodes, comprising:
a first branch coupled between a connection node and a first transceiver node of the plurality of transceiver nodes, the first branch comprising a first RF filter with a first passband;
a second branch coupled to the connection node;
a first bulk acoustic wave (BAW) resonator coupled to the connection node; and
a first inductor coupled to the connection node and in parallel with the first BAW resonator.

2. The multiplexing circuit of claim 1, wherein the first passband of the first RF filter is included in a first frequency range of interest.

3. The multiplexing circuit of claim 1, wherein the first BAW resonator and the first inductor are included in the first branch and coupled between the connection node and the first RF filter.

4. The multiplexing circuit of claim 1, wherein the first BAW resonator and the first inductor are coupled between the connection node and ground.

5. The multiplexing circuit of claim 2, wherein the first BAW resonator has a resonance or anti-resonance that is located within the first frequency range of interest.

6. The multiplexing circuit of claim 2, wherein the first BAW resonator functions as a capacitor outside the first frequency range of interest.

7. The multiplexing circuit of claim 2, wherein:
the second branch comprises a second RF filter; and
the second branch is coupled between the connection node and a second transceiver node of the plurality of transceiver nodes.

8. The multiplexing circuit of claim 7, wherein the first BAW resonator and the first inductor are included in the second branch and coupled between the connection node and the second RF filter.

9. The multiplexing circuit of claim 8, wherein the first BAW resonator is configured to have an anti-resonance within the first frequency range of interest, such that loading of the first RF filter that is provided by the second branch is reduced within a passband of the first RF filter.

10. The multiplexing circuit of claim 9, wherein the first BAW resonator blocks signals going from the first transceiver node toward the second branch.

11. The multiplexing circuit of claim 7, wherein:
the first RF filter is a transmit (TX) filter; and
the second RF filter is a receive (RX) filter.

12. The multiplexing circuit of claim 1, wherein the multiplexing circuitry further comprises:
a third branch coupled between a second connection node and a third transceiver node of the plurality of transceiver nodes, wherein the third branch comprises a third RF filter with a second passband that is included in a second frequency range of interest, and the second connection node is coupled to the connection node; and
a second BAW resonator coupled to the second connection node.

13. The multiplexing circuit of claim 12, wherein;
the first BAW resonator has a first resonance or anti-resonance that is located within a first frequency range of interest; and
the second BAW resonator has a second resonance or anti-resonance that is located within the second frequency range of interest.

14. The multiplexing circuit of claim 2, wherein:
the second branch is coupled between the connection node and the antenna node;
the first BAW resonator is connected in shunt between the connection node and ground; and
the first BAW resonator is configured to provide a short circuit of the second branch at the first frequency range of interest.

15. The multiplexing circuit of claim 14, wherein the first frequency range of interest is between the first passband of the first RF filter and a second passband of a second RF filter coupled between the connection node and a second transceiver node of the plurality of transceiver nodes.

16. A multiplexing circuit, comprising:
an antenna node configured to couple to a radio frequency (RF) antenna;
a plurality of transceiver nodes configured to couple to transceiver circuitry; and
multiplexing circuitry coupled between the antenna node and the plurality of transceiver nodes, comprising:
a first branch coupled between a first connection node and a first transceiver node of the plurality of transceiver nodes, the first branch comprising a first RF filter and a first inductor between the first connection node and the first RF filter;
a second branch coupled between a second connection node and a second transceiver node of the plurality of transceiver nodes, the second branch comprising a second RF filter; and
a first bulk acoustic wave (BAW) resonator coupled between the first connection node and the second connection node.

17. The multiplexing circuit of claim 16, wherein:
the first BAW resonator is configured to provide a frequency-dependent capacitance that has a first capacitance at a first frequency range of interest and a second capacitance at a second frequency range of interest; and
the first frequency range of interest is different from the second frequency range of interest, and the first capacitance is different from the second first capacitance.

18. The multiplexing circuit of claim 17, wherein:
the first frequency range of interest comprises a first passband of the first RF filter; and
the second frequency range of interest comprises a second passband of the second RF filter.

19. The multiplexing circuit of claim 17, wherein the multiplexing circuitry further comprises:
a third branch coupled between the second connection node and a third transceiver node of the plurality of transceiver nodes, the third branch comprising a third RF filter; and
a second BAW resonator coupled to the second connection node and configured to isolate the third branch from at least one of the first branch or the second branch in a third frequency range of interest.

20. The multiplexing circuit of claim 16, wherein:
the multiplexing circuitry further comprises a second BAW resonator coupled in series with the first BAW resonator between the first connection node and the second connection node; and
the first BAW resonator and the second BAW resonator have different resonances and/or different anti-resonances.

21. The multiplexing circuit of claim 16, wherein:
the multiplexing circuitry further comprises a second BAW resonator coupled in parallel with the first BAW resonator between the first connection node and the second connection node; and
the first BAW resonator and the second BAW resonator have different resonances and/or different anti-resonances.

22. The multiplexing circuit of claim 18, wherein the first BAW resonator has an anti-resonance that is located within the first frequency range of interest.

* * * * *